US008067972B2

(12) United States Patent
Iida et al.

(10) Patent No.: US 8,067,972 B2
(45) Date of Patent: Nov. 29, 2011

(54) FILTER CIRCUIT AND COMMUNICATION DEVICE

(75) Inventors: Sachio Iida, Chiba (JP); Atsushi Yoshizawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/773,648

(22) Filed: May 4, 2010

(65) Prior Publication Data

US 2010/0289567 A1 Nov. 18, 2010

(30) Foreign Application Priority Data

May 13, 2009 (JP) ................. P2009-116728

(51) Int. Cl.
*H03K 5/00* (2006.01)

(52) U.S. Cl. ........................ 327/337; 327/554

(58) Field of Classification Search .......... 327/336–337, 327/551–559
See application file for complete search history.

(56) References Cited

U.S. PATENT DOCUMENTS

| | | | | |
|---|---|---|---|---|
| 6,084,465 | A * | 7/2000 | Dasgupta | 327/554 |
| 7,113,029 | B2 * | 9/2006 | Hsieh et al. | 327/553 |
| 7,636,012 | B2 * | 12/2009 | Iida | 327/554 |
| 2009/0021297 | A1 | 1/2009 | Yoshizawa et al. | |
| 2009/0160577 | A1 * | 6/2009 | Yoshizawa et al. | 333/174 |

FOREIGN PATENT DOCUMENTS

| | | |
|---|---|---|
| JP | 2008-018220 | 1/2008 |
| JP | 2009-027389 | 2/2009 |

OTHER PUBLICATIONS

Bagheri et al.; "An 800MHz to 5GHz Software-Defined Radio Receiver in 90nm CMOS", IEEE International Solid-State Circuits Conference, ISSCC Deg. Tech. Papers, pp. 480-481, and p. 667, (2006).
Hirata et al.; A New FIR Switched-Capacitor Circuit for High Frequencies with Low-Power Consumption (Parallel Cyclic Type Circuit)., Shingakuron (A), vol. J75-A, No. 1, pp. 27-38, (1992).
Muhammad et al.; "Direct RF Sampling Mixer with Recursive Filtering in Charge Domain", IEEE, Proceedings of the International Symposium on Circuits and Systems (ISCAS '04), vol. 1, pp. I-577 to I-580, (2004).

* cited by examiner

*Primary Examiner* — Dinh T. Le
(74) *Attorney, Agent, or Firm* — Finnegan, Henderson, Farabow, Garrett & Dunner, L.L.P.

(57) ABSTRACT

A filter circuit includes a voltage-current conversion portion that converts a voltage signal input to an input terminal to a current signal, a first capacitor unit formed by a plurality of capacitors, and in which a current signal output from the voltage-current conversion portion is sequentially input to the capacitors, the unit adding and outputting electric charges of a group of capacitors to which the current signal is input, a second capacitor unit formed by a plurality of capacitors, and in which a current signal output from the first capacitor unit is sequentially input to the capacitors, the unit adding and outputting electric charges of a group of capacitors to which the current signal is input, and a plurality of connection nodes that respectively connect a given capacitor in the first capacitor unit and a capacitor in the second capacitor unit.

13 Claims, 19 Drawing Sheets

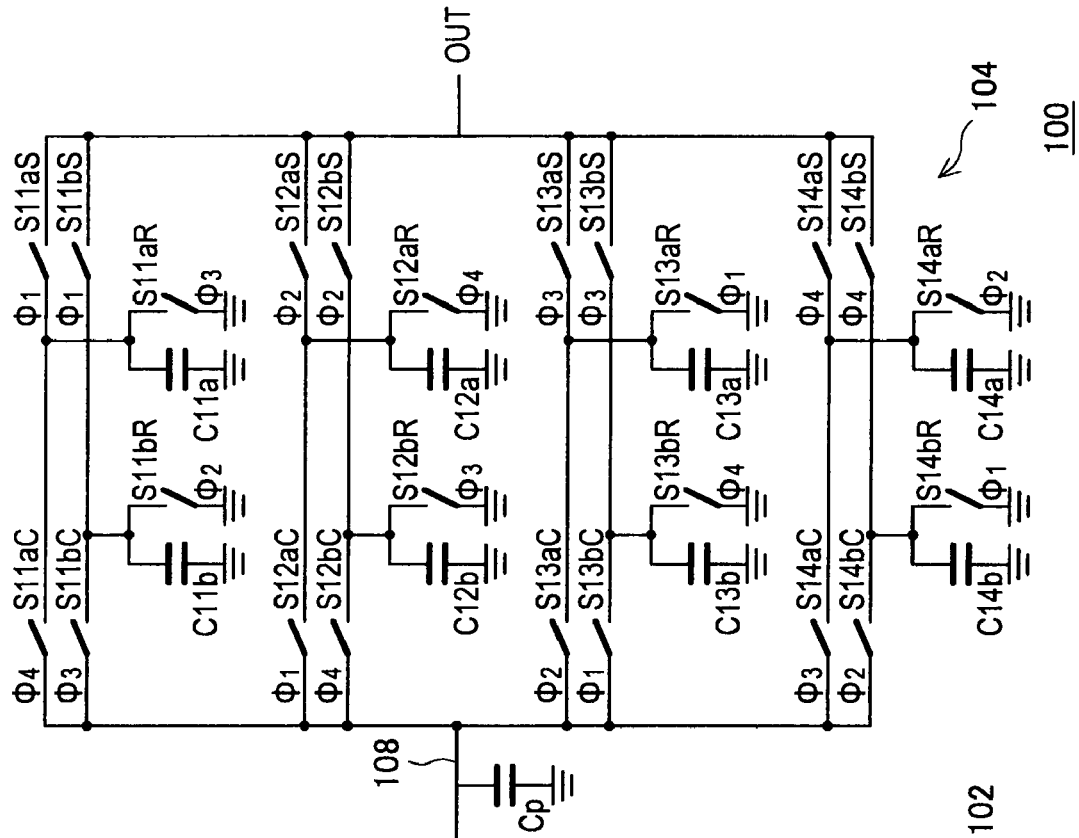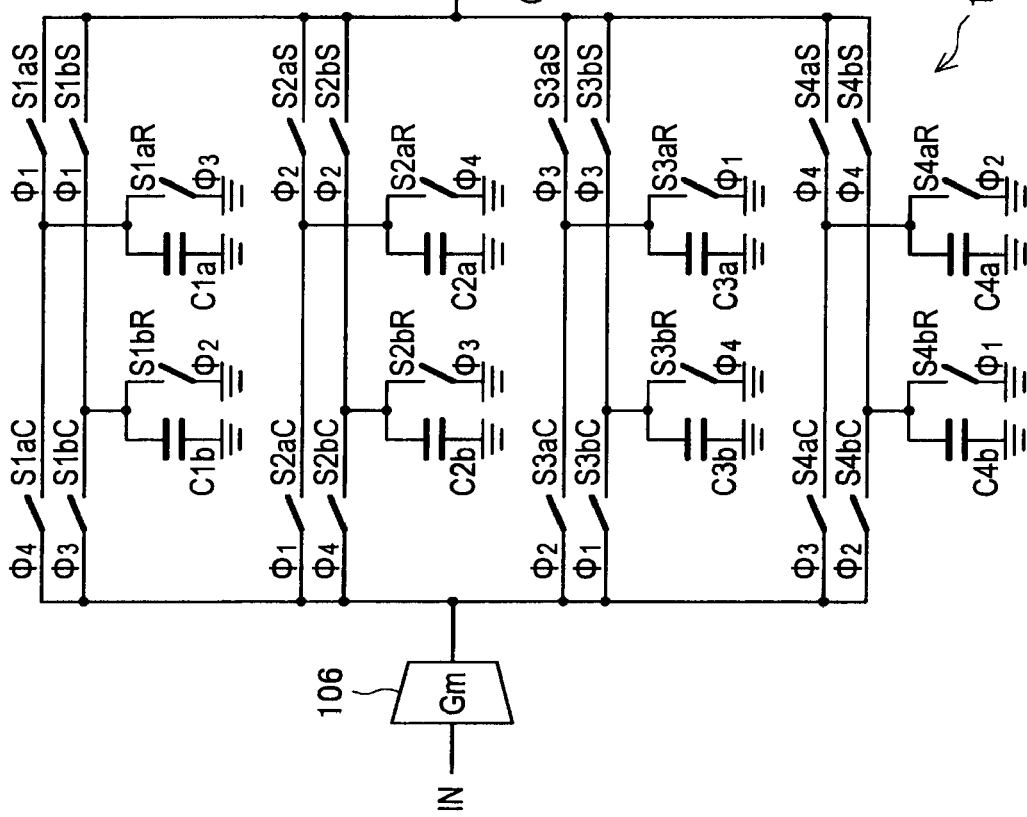
FIG.1

FIG.4
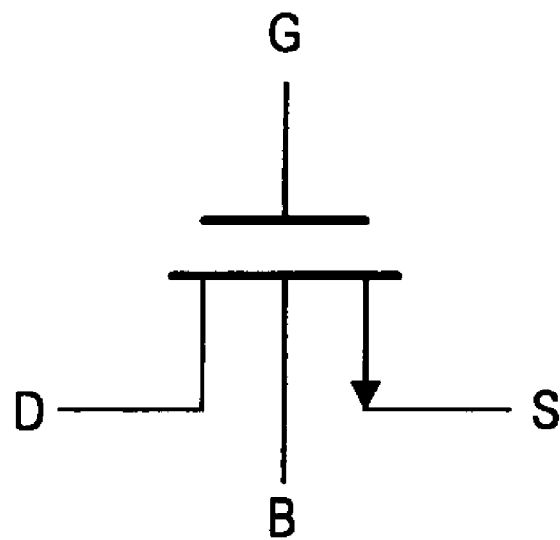
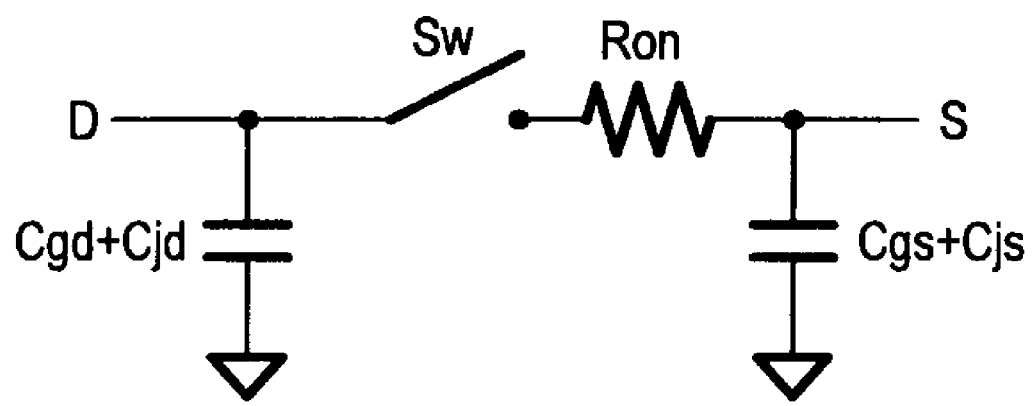

FILTER CIRCUIT AND COMMUNICATION DEVICE

BACKGROUND OF THE INVENTION

1. Field of the Invention

The present invention relates to a filter circuit and a communication device.

2. Description of the Related Art

Recently, along with miniaturization of a complementary metal oxide semiconductor (CMOS) process, the power supply voltage of a radio frequency (RF) circuit has been reduced. In a situation where the CMOS process is miniaturized, if the RF circuit is implemented using a conventional circuit method, the voltage margin becomes insufficient and the dynamic range of the signal amplitude is narrowed. Meanwhile, along with the miniaturization of the CMOS process, the cut-off frequency of a transistor increases. This is advantageous for operations in which high-speed switching operations are performed accurately in terms of time. Further, as the precision of lithography increases, the capacitance ratio of capacitors becomes accurate.

A digital RF technology is a new technology that implements the concept of discrete-time signal processing to the RF circuit, in order to obtain the above-described advantages while avoiding the problems caused by the miniaturization of the CMOS process. A charge domain filter is known as a main circuit in the digital RF technology field. The charge domain filter is a filter circuit formed by a transconductance amplifier, switches and capacitors. The charge domain filter is a circuit which performs sampling of analog signals by accumulating and discharging electric charges in synchronization with a clock, and which performs filtering and decimation by discrete-time signal processing (refer to Japanese Patent Application Publication No. JP-A-2008-18220; Japanese Patent Application Publication No. JP-A-2009-27389; R. Bagheri, "An 800 MHz to 5 GHz Software-Defined Radio Receiver in 90 nm CMOS," ISSCC Deg. Tech. Papers, pp. 1932-1941, February 2006; Hirata, Takahashi, Kato, Kikui and Takebe, "New high frequency, low-power FIR SC circuit (parallel cyclic type circuit)" Shingakuron (A), vol. 75-A, No. 1, PP. 27-38, January, 1992; and K. Muhammad and R. B. Staszewski, "Direct RF sampling mixer with recursive filtering in charge domain," in Proceedings of the International Symposium on Circuits and Systems (ISCAS '04), vol. 1, pp. I-577-I-580, Vancouver, BC, Canada, May 2004, sec. ASP-L29.5).

SUMMARY OF THE INVENTION

However, for example, with a circuit in which two-tap finite-duration impulse response (FIR) filters are connected in series, a plurality of switches are arranged on both sides of a connection node. These switches are formed by elements, such as metal oxide semiconductor field effect transistor (MOSFET) elements. Therefore, parasitic capacitance of the elements is generated at the connection node. As a result, the frequency characteristics of the filter circuit are changed as a result of the parasitic capacitance.

In light of the foregoing, it is desirable to provide a novel and improved filter circuit and communication device that are capable of suppressing changes in frequency characteristics caused by parasitic capacitance.

According to an embodiment of the present invention, there is provided a filter circuit includes a voltage-current conversion portion that converts a voltage signal input to an input terminal to a current signal, a first capacitor unit which is formed by a plurality of capacitors, and in which a current signal output from the voltage-current conversion portion is sequentially input to each of the capacitors in each cycle, the first capacitor unit adding and outputting electric charges of a group of capacitors to which the current signal is input, a second capacitor unit which is formed by a plurality of capacitors, and in which a current signal output from the first capacitor unit is sequentially input to each of the capacitors in each cycle, the second capacitor unit adding and outputting electric charges of a group of capacitors to which the current signal is input, and a plurality of connection nodes that respectively connect a given capacitor that outputs electric charge in the first capacitor unit and a capacitor in the second capacitor unit to which a current signal caused by the output of the electric charge is input.

In this configuration, the plurality of connection nodes are provided with a reset switch for resetting parasitic capacitance.

In this configuration, in a reset period of each of the capacitors belonging to the second capacitor unit, parasitic capacitance of the connection node to which the corresponding capacitor is connected is reset.

In this configuration, a particular capacitor belonging to the second capacitor unit is constantly connected to the connection node, and in a reset period of the particular capacitor, parasitic capacitance of the connection node to which the particular capacitor is connected is reset.

According to another embodiment of the present invention, there is provided a filter circuit includes a first voltage-current conversion portion that converts a positive phase voltage signal input to an input terminal to a current signal, a first capacitor unit which is formed by a plurality of capacitors, and in which a current signal output from the first voltage-current conversion portion is sequentially input to each of the capacitors in each cycle, the first capacitor unit adding and outputting electric charges of a group of capacitors to which the current signal is input, a second capacitor unit which is formed by a plurality of capacitors, and in which a current signal output from the first capacitor unit is sequentially input to each of the capacitors in each cycle, the second capacitor unit adding and outputting electric charges of a group of capacitors to which the current signal is input, a first plurality of connection nodes that respectively connect a given capacitor that outputs electric charge in the first capacitor unit and a capacitor in the second capacitor unit to which a current signal caused by the output of the electric charge is input, a second voltage-current conversion portion that converts a negative phase voltage signal input to an input terminal to a current signal, a third capacitor unit which is formed by a plurality of capacitors, and in which a current signal output from the second voltage-current conversion portion is sequentially input to each of the capacitors in each cycle, the third capacitor unit adding and outputting electric charges of a group of capacitors to which the current signal is input, a fourth capacitor unit which is formed by a plurality of capacitors, and in which a current signal output from the third capacitor unit is sequentially input to each of the capacitors in each cycle, the fourth capacitor unit adding and outputting electric charges of a group of capacitors to which the current signal is input, a second plurality of connection nodes that respectively connect a given capacitor that outputs electric charge in the third capacitor unit and a capacitor in the fourth capacitor unit to which a current signal caused by the output of the electric charge is input, and a third plurality of connection nodes that connect each of the first plurality of connection nodes and each of the second plurality of connection nodes.

According to another embodiment of the present invention, there is provided a communication device including a filter circuit that includes a voltage-current conversion portion that converts a voltage signal input to an input terminal to a current signal, a first capacitor unit which is formed by a plurality of capacitors, and in which a current signal output from the voltage-current conversion portion is sequentially input to each of the capacitors in each cycle, the first capacitor unit adding and outputting electric charges of a group of capacitors to which the current signal is input, a second capacitor unit which is formed by a plurality of capacitors, and in which a current signal output from the first capacitor unit is sequentially input to each of the capacitors in each cycle, the second capacitor unit adding and outputting electric charges of a group of capacitors to which the current signal is input, and a plurality of connection nodes that respectively connect a given capacitor that outputs electric charge in the first capacitor unit and a capacitor in the second capacitor unit to which a current signal caused by the output of the electric charge is input.

According to the embodiments of the present invention described above, it is possible to reliably suppress changes in frequency characteristics caused by parasitic capacitance.

BRIEF DESCRIPTION OF THE DRAWINGS

FIG. 1 is a schematic diagram showing, as an example of a charge domain FIR filter 100, a circuit that is formed by connecting two-tap FIR filters in series;

FIG. 4 is a schematic diagram showing capacitance generated in a MOSFET;

DETAILED DESCRIPTION OF THE EMBODIMENT(S)

Figure 2:
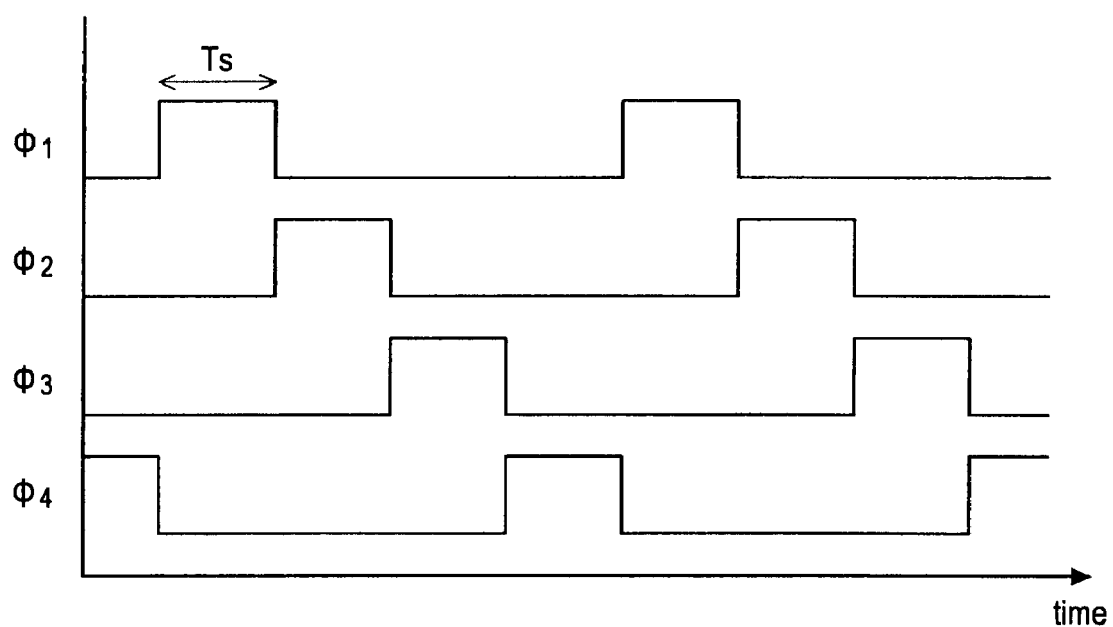
FIG. 2 is a timing chart showing timings at which waveforms of clock signals Φ1 to Φ4 change to a high level.

Hereinafter, preferred embodiments of the present invention will be described in detail with reference to the appended drawings. Note that, in this specification and the appended drawings, structural elements that have substantially the same function and structure are denoted with the same reference numerals, and repeated explanation of these structural elements is omitted.

Exemplary embodiments will be explained in the order shown below.

1. First embodiment (an example in which an N-path filter is used)
 (1) Background technology
 (2) Structure and operation of a filter circuit according to the first embodiment of the present invention
2. Second embodiment (an example in which parasitic capacitance is reset by adding reset switches)
3. Third embodiment (an example in which parasitic capacitance is reset by adding timing signals)
4. Fourth embodiment (an example in which parasitic capacitance is reset without adding a reset switch and a timing signal)
5. Fifth embodiment (an example in which parasitic capacitance is used to widen the frequency band)
6. Sixth embodiment (an example of a communication device provided with the filter circuit according to each of the embodiments)

1. First Embodiment (1) Background Technology

A charge domain finite-duration impulse response (FIR) filter will be described as a background technology of a charge domain filter according to a first embodiment. FIG. 1 is a schematic diagram showing, as an example of the charge domain FIR filter, a circuit that is formed by connecting two-tap FIR filters 102 and 104 in series. Hereinafter, the structure and operation of a two-tap FIR filter 100 shown in FIG. 1 will be explained.

In FIG. 1, an input terminal is denoted by IN and an output terminal is denoted by OUT. A Gm 106 is a transconductance amplifier that converts a voltage signal applied to the input terminal IN to a current signal and outputs the current signal. Eight sampling capacitors C1a, C1b, C2a, C2b, C3a, C3b, C4a and C4b of the two-tap FIR filter 102 of the first stage are connected in parallel to an output terminal of the Gm 106, and a capacitor unit is formed by these capacitors. Each of the sampling capacitors C1a, C1b, C2a, C2b, C3a, C3b, C4a and C4b has a same capacitance C.

Reset switches S1aR, S1bR, S2aR, S2bR, S3aR, S3bR, S4aR and S4bR are connected to the sampling capacitors C1a, C1b, C2a, C2b, C3a, C3b, C4a and C4b, respectively.

Further, charge switches S1aC, S1bC, S2aC, S2bC, S3aC, S3bC, S4aC and S4bC are connected to the sampling capacitors C1a, C1b, C2a, C2b, C3a, C3b, C4a and C4b, respectively. Further, share switches S1aS, S1bS, S2aS, S2bS, S3aS, S3bS, S4aS and S4bS are connected to the sampling capacitors C1a, C1b, C2a, C2b, C3a, C3b, C4a and C4b, respectively. In this manner, three types of switches, namely, the reset switch, the charge switch and the share switch are connected to each of the sampling capacitors C1a, C1b, C2a, C2b, C3a, C3b, C4a and C4b.

Each of sampling capacitors C11a, C11b, C12a, C12b, C13a, C13b, C14a and C14b of the two-tap FIR filter 104 of the second stage has the same capacitance C. Reset switches S11aR, S11bR, S12aR, S12bR, S13aR, S13bR, S14aR and S14bR are connected to the sampling capacitors C11a, C11b, C12a, C12b, C13a, C13b, C14a and C14b, respectively. Further, charge switches S11aC, S11bC, S12aC, S12bC, S13aC, S13bC, S14aC and S14bC are connected to the sampling capacitors C11a, C11b, C12a, C12b, C13a, C13b, C14a and C14b, respectively. Further, share switches S11aS, S11bS, S12aS, S12bS, S13aS, S13bS, S14aS and S14bS are connected to the sampling capacitors C11a, C11b, C12a, C12b, C13a, C13b, C14a and C14b, respectively. In this manner, three types of switches, namely, the reset switch, the charge switch and the share switch are connected to each of the sampling capacitors C11a, C11b, C12a, C12b, C13a, C13b, C14a and C14b.

Each of the reset switches, the charge switches and the share switches shown in FIG. 1 are driven by waveforms of clock signals $\Phi 1$ to $\Phi 4$, which are shown for each of the switches in FIG. 1. Each of the switches is turned on in a timing phase in which each of the waveforms of the clock signals $\Phi 1$ to $\Phi 4$ changes to a high level. For example, the share switch S1aS and the share switch S1bS are turned on in the timing phase in which the waveform of the clock signal $\Phi 1$ changes to the high level. Further, the charge switch S1bC is turned on in the timing phase in which the waveform of the clock signal $\Phi 3$ changes to the high level. The charge switch S1aC is turned on in the timing phase in which the waveform of the clock signal $\Phi 4$ changes to the high level.

FIG. 2 is a timing chart showing timings at which the waveforms of the clock signals $\Phi 1$ to $\Phi 4$ change to the high level. As shown in FIG. 2, the waveforms of the clock signals $\Phi 1$ to $\Phi 4$ are respectively driven such that the switches are sequentially turned on in a section Ts.

The switches are respectively turned on in the timing phase in which the waveforms of the clock signals $\Phi 1$ to $\Phi 4$ shown in FIG. 2, which correspond to the $\Phi 1$ to $\Phi 4$ shown in the vicinity of the switches in FIG. 1, change to the high level. Each of the sampling capacitors is in one of a reset state, a charge state and a share state in the timing phase in which one of the three types of switches connected to each of the sampling capacitors is turned on. More specifically, each of the sampling capacitors is in the reset state in the timing phase in which the reset switch connected to each of the sampling capacitors is turned on. Each of the sampling capacitors is in the charge state in the timing phase in which the charge switch connected to each of the sampling capacitors is turned on. Each of the sampling capacitors is in the share state in the timing phase in which the share switch connected to each of the sampling capacitors is turned on. Further, each of the sampling capacitors is in a hold state in the timing phase in which all the switches connected to each of the sampling capacitors are turned off.

In FIG. 1, a capacitance CP connected to a connection node between the first stage FIR filter 102 and the second stage FIR filter 104 indicates a parasitic capacitance generated in the connection node. Accordingly, the capacitance CP does not exist as a capacitor formed by actual elements.

Figure 3:
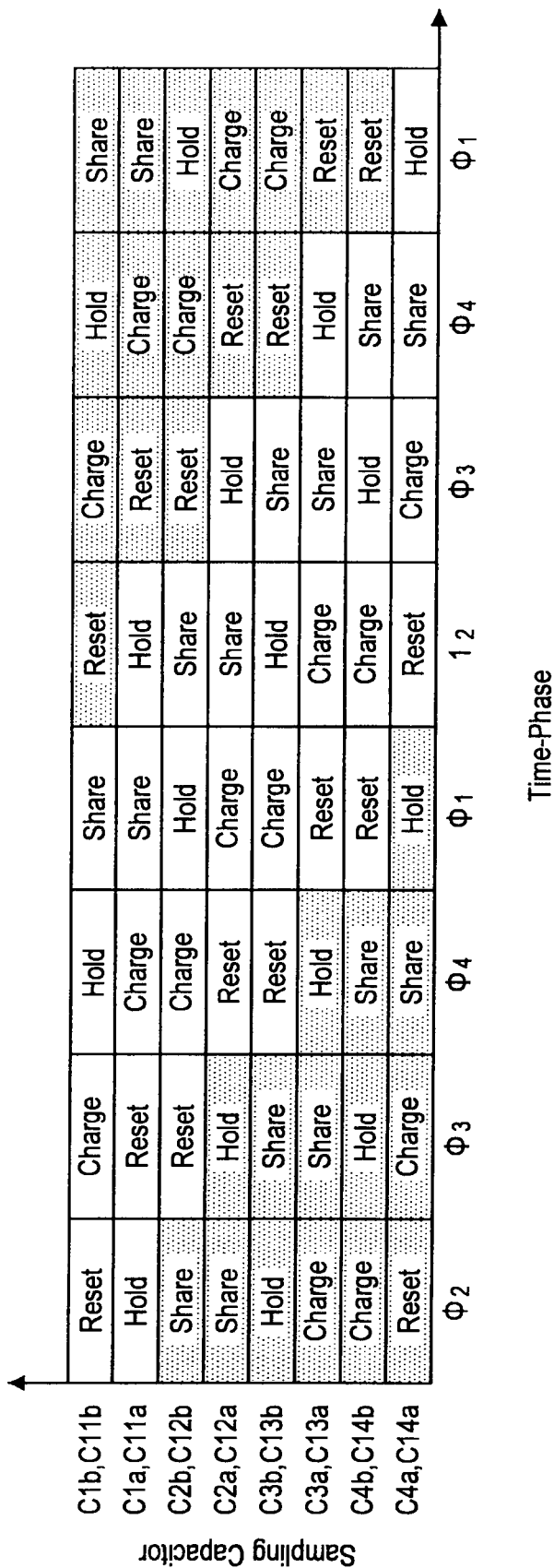
FIG. 3 is a schematic diagram showing a relationship between a timing phase and a state of each sampling capacitor.

FIG. 3 is a schematic diagram showing a relationship between the timing phase and the state of each of the sampling capacitors. The vertical axis represents each of the sampling capacitors, and the horizontal axis represents the timing phase. Here, the circuit operation will be explained using, as an example, a pair of the sampling capacitors C2b and C2a in the first stage FIR filter 102. First, the state of the sampling capacitor C2b will be explained with reference to FIG. 3. When the reset switch S2bR is turned on in the timing phase of the clock signal $\Phi 3$, the sampling capacitor C2b is changed to the reset state. As a result, the electric charge that has been accumulated in the sampling capacitor C2b is discharged. Next, when the charge switches S2bC and S1aC are turned on in the timing phase of the clock signal $\Phi 4$, the sampling capacitor C2b is changed to the charge state, as well as the sampling capacitor C1a. In this state, among all the sampling capacitors shown in FIG. 3, only the sampling capacitor C1a and the sampling capacitor C2b are in the charge state. Therefore, half of the electric current supplied from the Gm 106 flows into the sampling capacitor C2b, and the remaining half flows into the sampling capacitor C1a. As a result, electric charge is stored in the sampling capacitors C2b and C1a. Next, in the timing phase of the clock signal $\Phi 1$, as all of the switches S2bR, S2bC and S2bS connected to the sampling capacitor C2b are turned off, the sampling capacitor C2b is changed to the hold state. As a result, the electric charge accumulated in the sampling capacitor C2b is held. Next, in the timing phase of the clock signal $\Phi 2$, as the share switches S2aS and S2bS are turned on, the sampling capacitor C2b is changed to the share state, as well as the sampling capacitor C2a. Thus, the two sampling capacitors C2b and C2a are connected, and the electric charge stored in the two sampling capacitors C2b and C2a are added. Then, the added electric charge is transmitted to the second stage FIR filter 104. In the second stage FIR filter 104, the charge switches S13aC and S14bC are on in the timing phase of the clock signal $\Phi 2$. Therefore, the electric charge stored in the first stage sampling capacitors C2a and C2b is distributed to the second stage sampling capacitors C13a and C14b such that a quarter of the electric charge is distributed to each of the sampling capacitors C13a and C14b.

In a similar manner, when the reset switch S2aR is turned on in the timing phase of the clock signal $\Phi 4$, the sampling capacitor C2a is changed to the reset state. As a result, the electric charge that has been accumulated in the sampling capacitor C2a is discharged. Next, when the charge switches S2aC and S3bC are turned on in the timing phase of the clock signal $\Phi 1$, the sampling capacitor C2a is changed to the charge state, as well as the sampling capacitor C3b. Thus, half of the electric current supplied from the Gm 106 flows into the sampling capacitor C2a. As a result, electric charge is stored in the sampling capacitor C2a. Next, in the timing phase of the clock signal $\Phi 2$, as the share switches S2aS and S2bS are turned on, the sampling capacitor C2a is changed to the share state, as well as the sampling capacitor C2b. Thus, the two sampling capacitors C2a and C2b are connected, and the electric charge stored in the two sampling capacitors C2a and C2b are added. Then, as described above, the electric charge stored in the first stage sampling capacitors C2a and C2b is distributed to the second stage sampling capacitors C13a and C14b such that each capacitor has a quarter of the electric charge. Next, in the timing phase of the clock signal $\Phi 3$, as all of the switches S2aR, S2aC and S2aS connected to the sampling capacitor C2a are turned off, the sampling capacitor C2a is changed to the hold state. As a result, the electric charge accumulated in the sampling capacitor C2a is held.

The circuit of the FIR filter 100 shown in FIG. 1 is a parallel cyclic type circuit. A similar state transition is performed by shifting the timing phase, for other pairs of sampling capacitors (a pair of the sampling capacitors C1a and C1b, a pair of the sampling capacitors C3a and C3b, and a pair of the sampling capacitors C4a and C4b). Then, one of the pairs of the sampling capacitors C11 to C14 is connected to an output terminal (OUT) of the FIR filter 100, so that electric charge is output continuously without interruption.

As shown in FIG. 3, in the share state of the capacitors C2a and C2b in the timing phase of the clock signal Φ2, one clock preceding electric charge stored in the first stage capacitor C2a and two clock preceding electric charge stored in the first stage capacitor C2b are obtained such that the electric current of the Gm 106 flows half-and-half into the two capacitors C2a and C2b and is stored as electric charge. Therefore, the electric charge accumulated in each of the capacitors C2a and C2b is half of the input electric charge. Further, in the share state, the electric charge is distributed to the two sampling capacitors C13a and C14b of the second stage, and a quarter of the input electric charge is transmitted to each of the two sampling capacitors C13a and C14b of the second stage. Therefore, an output electric charge Qout1(n) of the first stage at an n-th clock is represented by Expression 1.

Expression 1

$$Qout1(n) = \frac{Qin1(n-1)}{4} + \frac{Qin1(n-2)}{4} \qquad \text{Expression 1}$$

In Expression 1, Qin1(n−1) indicates the electric charge that is stored in the first stage sampling capacitors one clock preceding, and Qin1(n−2) indicates the electric charge that is stored in the first stage sampling capacitors two clocks preceding. When Expression 1 is z-transformed, the relationship between Qout and Qin is obtained by Expression 2.

Expression 2

$$\frac{Qout1(z)}{Qin(z)} = \frac{z^{-1} + z^{-2}}{4} \qquad \text{Expression 2}$$

Also in the second stage, in the share state, one clock preceding electric charge and two clock preceding electric charge that are stored in the two sampling capacitors of the second stage are obtained such that the output electric charge of the first stage is distributed half-and-half into the two sampling capacitors. Therefore, each of the electric charges is half of the output electric charge of the first stage. Therefore, an output electric charge of the second stage is represented by Expression 3.

Expression 3

$$Qout2(n) = \frac{Qout1(n-1)}{2} + \frac{Qout1(n-2)}{2} \qquad \text{Expression 3}$$

When Expression 3 is z-transformed, the relationship between a second stage output Qout2 and a first stage output Qout1 is obtained by Expression 4.

Expression 4

$$\frac{Qout2(z)}{Qout1(z)} = \frac{z^{-1} + z^{-2}}{2} \qquad \text{Expression 4}$$

Further, from Expression 2 and Expression 4, the relationship between a second stage output Qout2 and a first stage input Qin1 is obtained by Expression 5.

Expression 5

$$\frac{Qout2(z)}{Qin1(z)} = \frac{z^{-1} + z^{-2}}{4} \cdot \frac{z^{-1} + z^{-2}}{2} = \frac{z^{-2} + 2z^{-3} + z^{-4}}{8} \qquad \text{Expression 5}$$

As described above, it can be seen that a three-tap FIR filter is formed in the circuit shown in FIG. 1, as a result of connecting the two-tap FIR filters in series. In section 3.1 of "New high frequency, low-power FIR SC circuit (parallel cyclic type circuit)" Shingakuron (A), vol. 75-A, No. 1, PP. 27-38, January, 1992, it is indicated that, as the order of the parallel cyclic type circuit increases, the number of necessary capacitors increases in proportion to the square of the order, and it is therefore appropriate to form a high-order filter by connecting low-order circuits in series.

However, as described above, the parasitic capacitance CP exists in the connection node between the two-tap FIR filter of the first stage and the two-tap FIR filter of the second stage. The parasitic capacitance CP is caused by the capacitance of a metal oxide semiconductor field effect transistor (MOSFET) that is used in the switches. FIG. 4 is a schematic diagram showing the capacitance generated in the MOSFET. As shown in FIG. 4, a capacitance (Cgd+Cjd) generated between a drain and a gate and between the drain and the GND, and a capacitance (Cgs+Cjs) generated between a source and the gate and between the source and the GND are generated in the MOSFET.

In the circuit shown in FIG. 1, let us focus attention on a node 108 between the first stage FIR filter 102 and the second stage FIR filter 104. Connected to the node 108 are the sixteen switches S1aS, S1bS, S2aS, S2bS, S3aS, S3bS, S4aS, S4bS, S11aC, S11bC, S12aC, S12bC, S13aC, S13bC, S14aC and S14bC. Accordingly, the parasitic capacitance of the node 108 is the largest in the circuit shown in FIG. 1.

As shown in a FIG. 4 "IIR operation with cyclic charge readout" of the above-described "New high frequency, low-power FIR SC circuit (parallel cyclic type circuit)" Shingakuron (A), vol. 75-A, No. 1, PP. 27-38, January, 1992, it is known that an IIR filter with a transfer function represented by Expression 6 is formed as a result of the parasitic capacitance CP.

Expression 6

$$H_{IIR}(z) = \frac{1-\alpha}{1-\alpha \cdot z^{-1}} \qquad \text{Expression 6}$$

In Expression 6, a is expressed by the following Expression 7.

Expression 7

$$\alpha = \frac{C_H}{C_H + C_R}$$ Expression 7

For example, in the circuit shown in FIG. 1, if it is assumed that the parasitic capacitance of one side of each of the switches is 20 fF, when the number of the switches is sixteen, the total parasitic capacitance is CP=320 ff. This value corresponds to $C_H$ in Expression 7.

If it is assumed that the capacitance of one sampling capacitor is 250 fF, four sampling capacitors are connected to the node 108 in each timing phase. Therefore, the total capacitance of the four sampling capacitors is 1000 fF. Further, three types of switches, namely, the reset switch, the charge switch and the share switch are attached to each of the sampling capacitors. Therefore, the parasitic capacitance of the total of twelve switches is generated. If it is assumed that the parasitic capacitance of one side of each of the switches is 20 fF, a parasitic capacitance of 240 fF is generated when the number of the switches is twelve. Accordingly, if the capacitances that are connected to the node 108 in each timing phase are summed, the summed value is obtained by the equation 1000 fF+240 fF=1240 fF. This value corresponds to $C_R$ in Expression 7. Then, if $C_H$=320 fF and $C_R$=1240 fF are substituted into Expression 7, the equation α=0.205 is obtained.

Figure 5:
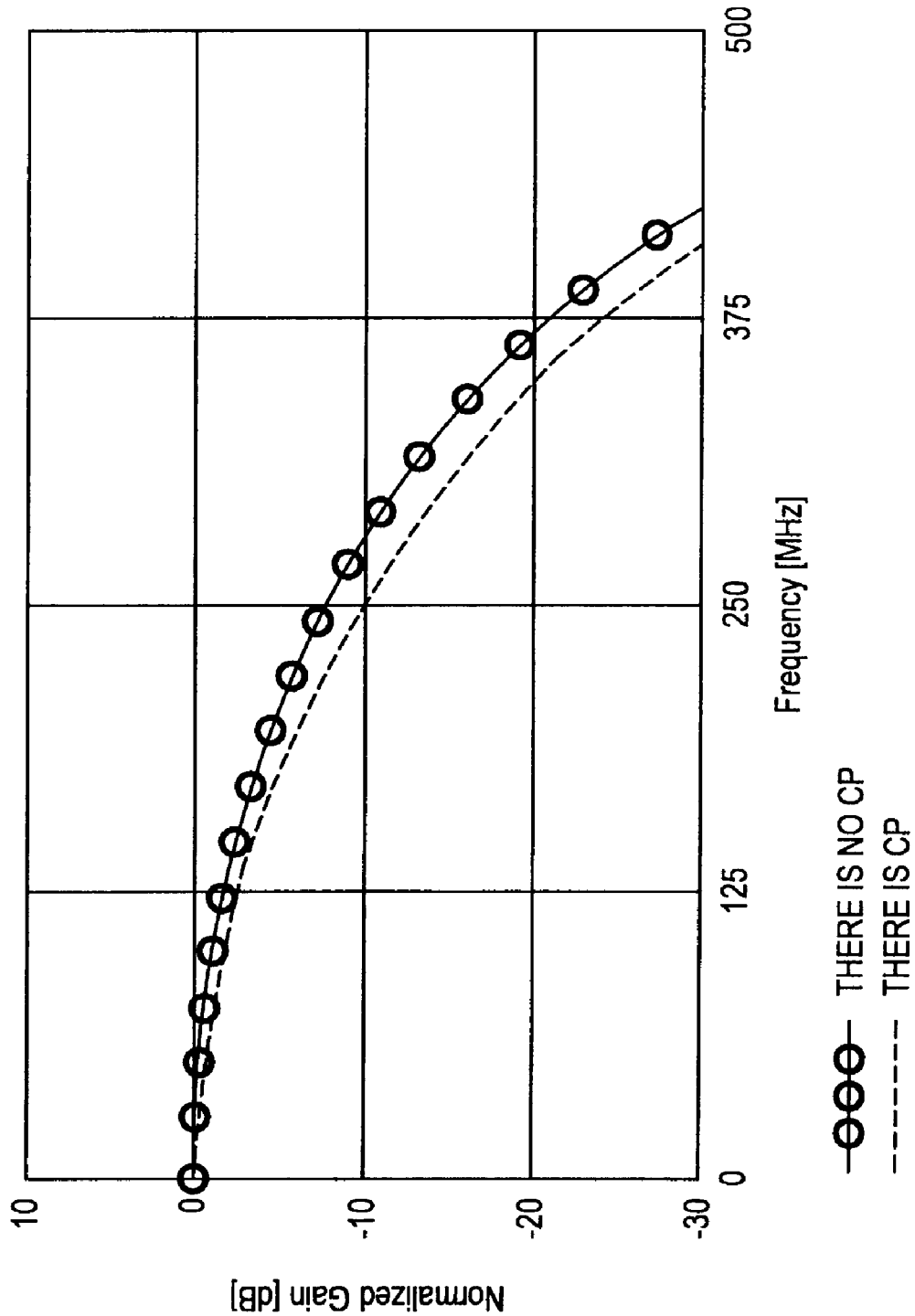
FIG. 5 is a characteristic diagram showing a manner in which frequency characteristics change depending on whether or not there is a parasitic capacitance CP.

As a consequence, when the circuit shown in FIG. 1 is operated with the sampling time Ts=1 ns, the change in frequency characteristics is generated as shown in FIG. 5 depending on whether or not there is the parasitic capacitance CP. The frequency characteristics shown by the solid line in FIG. 5 indicate a case in which α=0. Meanwhile, the frequency characteristics shown by the dotted line in FIG. 5 indicate the above-described case in which α=0.205. It is found from FIG. 5 that the frequency band is narrowed by generation of the parasitic capacitance CP.

The above-described result is caused by connecting the two-tap FIR filters 102 and 104 in series. In this way, the above-described change in frequency characteristics is generated by connecting only two two-tap FIR filters in series. When a high-order FIR filter is used, more switches are used and it is therefore apparent that a significant change in frequency characteristics is generated.

(2) Structure and Operation of a Filter Circuit According to the First Embodiment of the Present Invention In light of the foregoing, a charge domain FIR filter that does not cause a change in frequency characteristics is provided as a filter circuit according to the first embodiment of the present invention.

Figure 6:
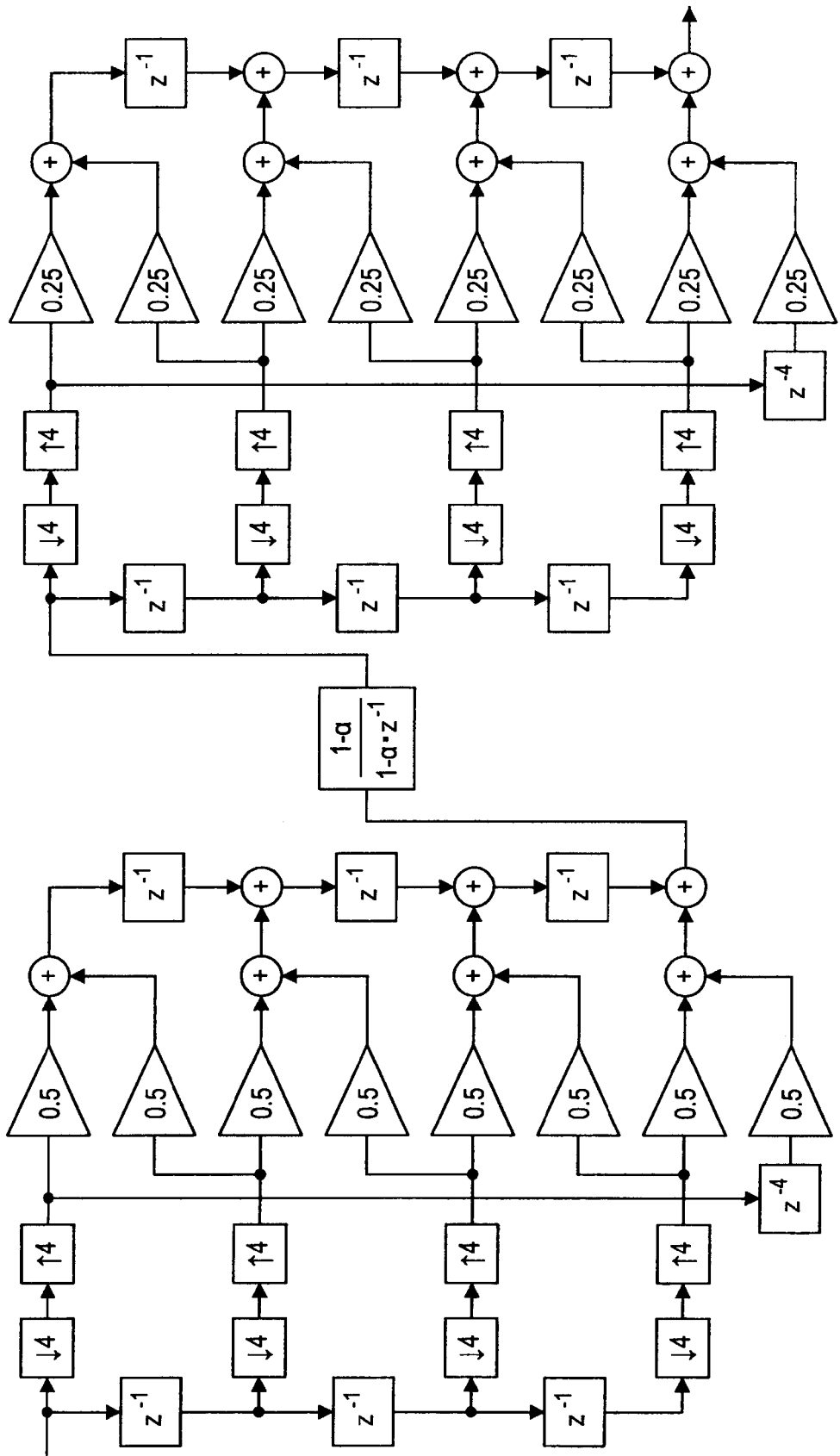
FIG. 6 is a schematic diagram showing a block structure of the charge domain FIR filter 100 shown in FIG. 1.

FIG. 6 shows a block diagram of the charge domain FIR filter 100 shown in FIG. 1. The block diagram is used to clarify the procedure to solve the problem. The left half of FIG. 6 shows the two-tap FIR filter of the first stage, the center of FIG. 6 shows the IIR filter generated by parasitic capacitance, and the right half of FIG. 6 shows the two-tap FIR filter of the second stage. In FIG. 6, ↓4 indicates decimation 4 (processing to remove three sample signals from four sample signals), and ↑4 indicates interpolation 4 (processing to add a signal "0" to the sample on which decimation 4 has been performed). Further, $Z^{-1}$ indicates a delay of one sample time, and $Z^{-4}$ indicates a delay of four sample times.

Figure 7:
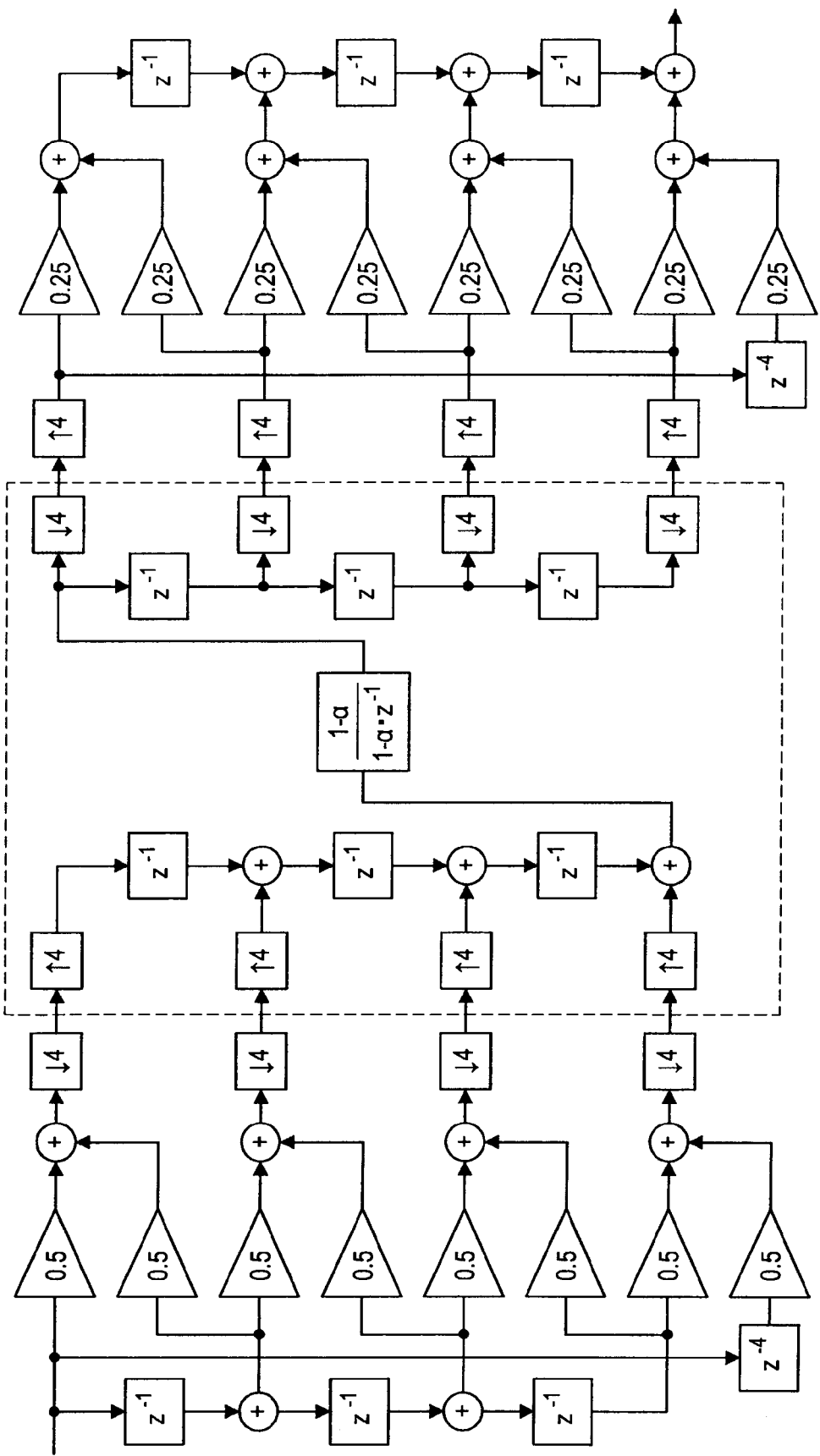
FIG. 7 is a schematic diagram showing a modified structure of the block structure shown in FIG. 6.

The positions of the first stage decimation 4 and the first stage interpolation 4 are equivalent even if they are moved to the rear side of an adder of the two-tap FIR filter. Therefore, the block diagram shown in FIG. 6 can be modified to the diagram shown in FIG. 7. Further, when looking at the section encircled by the broken line in FIG. 7, it is found that the connection node 108 between the first stage and the second stage can be divided into four nodes, by arranging them in parallel. As a result, the block diagram shown in FIG. 8 is obtained.

Figure 8:
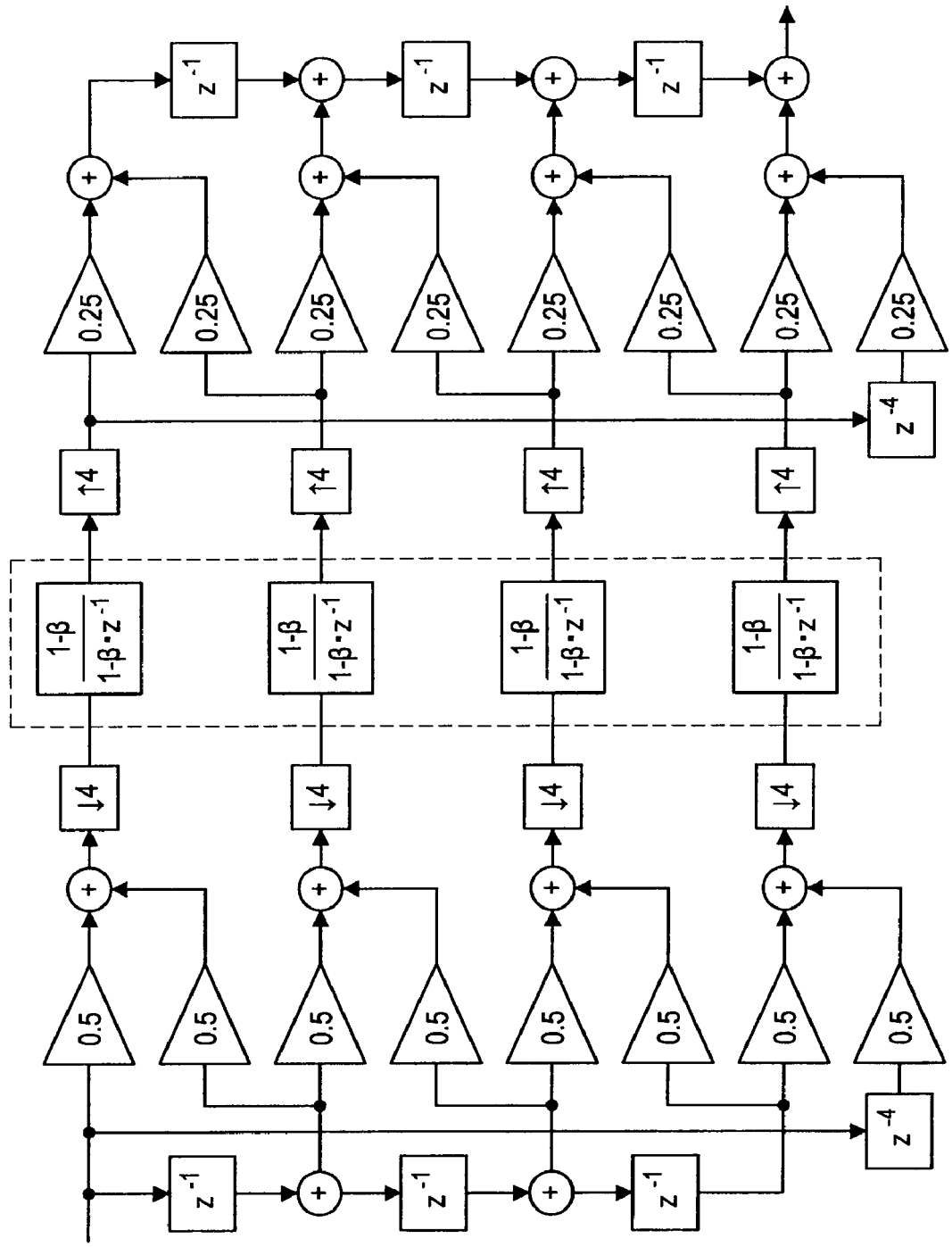
FIG. 8 is a schematic diagram showing a structure in which a connection node between the first stage and the second stage shown in FIG. 7 is separated and connected in parallel.

The section encircled by the broken line in FIG. 8 indicates the nodes that connect the first stage FIR filter and the second stage FIR filter while the nodes are connected in parallel. In this case, the parasitic capacitance is also divided into four parasitic capacitances, and the number of parasitic IIR filters is also four. The filter circuit that is divided in this manner into a plurality of paths is a circuit called an N-path filter. In the N-path filter, a narrow band filter having a bandwidth that is 1/N of that of the original filter is obtained (N=4, in the present embodiment). If the frequency band of the parasitic IIR filter changes to the 1/N band and this change reduces an impact on the frequency characteristics of the FIR filter, this serves to solve the above-described parasitic capacitance problem. Further, a discharge timing of the electric charge of the parasitic capacitances is obtained as a result of forming the N-path filter. Thus, the problem can be solved fundamentally.

Figure 9:
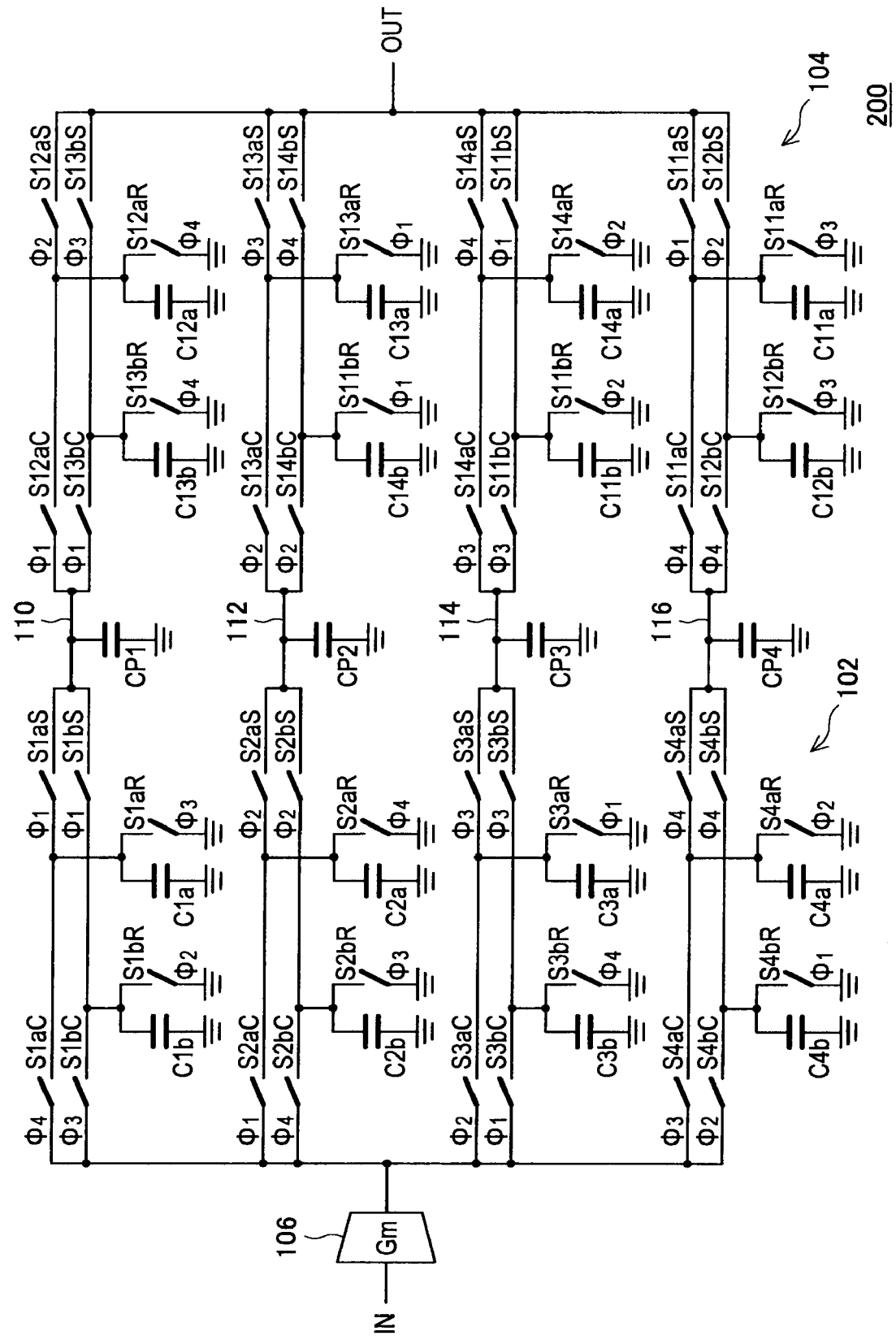
FIG. 9 is a schematic diagram showing a charge domain FIR filter 200 according to a first embodiment of the present invention.
Figure 10:
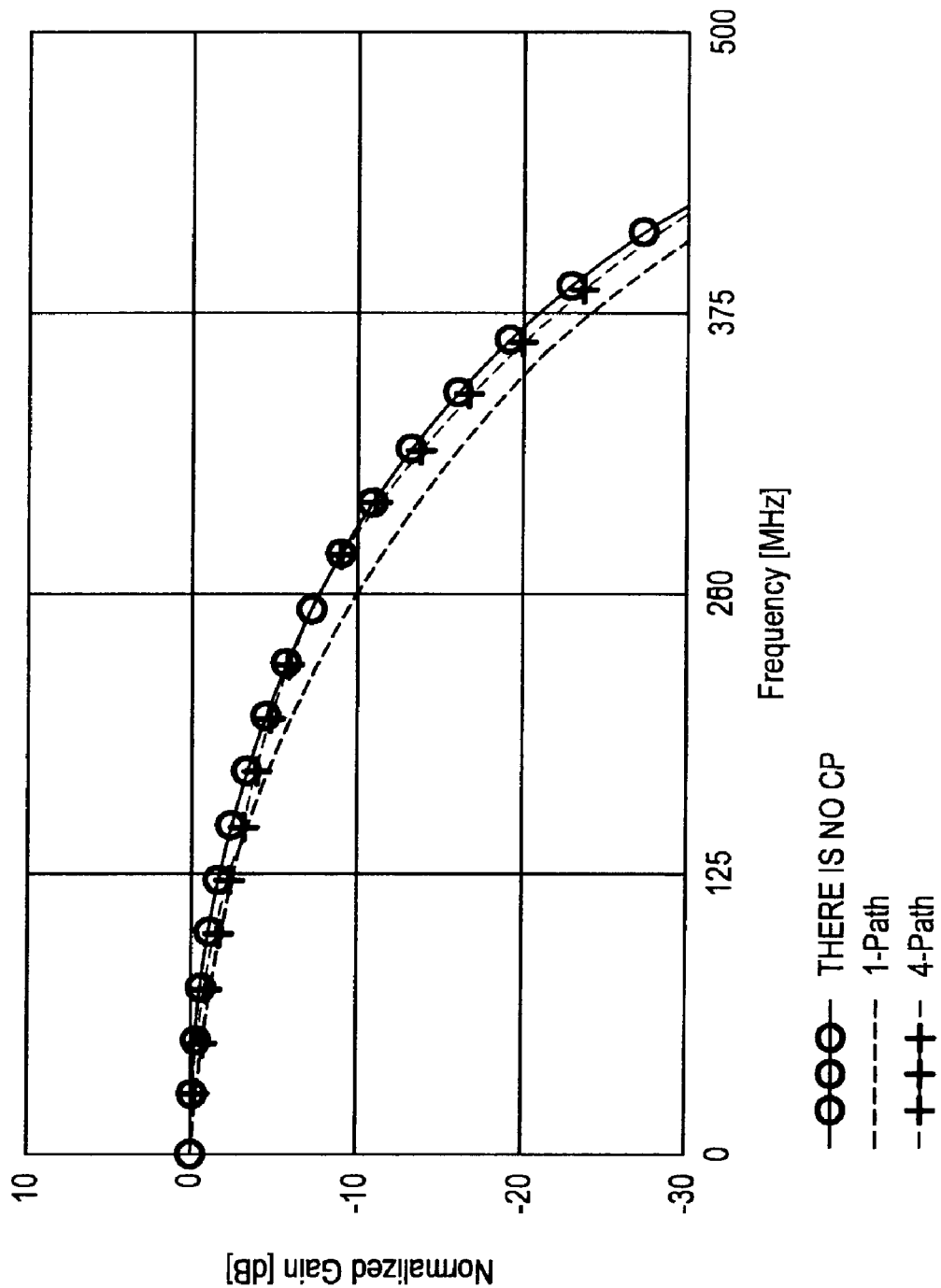
FIG. 10 is a characteristic diagram showing frequency characteristics of the charge domain FIR filter 200 according to the first embodiment.

In light of the foregoing, FIG. 9 is a schematic diagram showing a charge domain FIR filter 200 according to the first embodiment of the present invention. The FIR filter 200 shown in FIG. 9 is obtained by dividing the FIR filter 100 shown in FIG. 1 into four paths, and by modifying the connection between the FIR filters 102 and 104 based on FIG. 8. Only four switches are connected to each of nodes 110, 112, 114 and 116. Therefore, the parasitic capacitance is 80 fF, and a coefficient 13 of the IIR filter in FIG. 8 is β=0.06. When the FIR filter 200 is operated with the sampling time Ts=1 ns, the frequency characteristics are as indicated by a 4-path line in FIG. 10. It is therefore possible to significantly reduce a change in frequency characteristics, as compared to the characteristics (indicated by a 1-path line in FIG. 10) of the circuit in FIG. 1.

According to the first embodiment as described above, in the charge domain FIR filter 200 that is formed by connecting the two-tap FIR filters 102 and 104 in series, the connection node 108 between the first stage and the second stage is divided to have a parallel arrangement. Thus, it is possible to reduce the change in frequency characteristics caused by parasitic capacitance.

2. Second Embodiment

Figure 11:
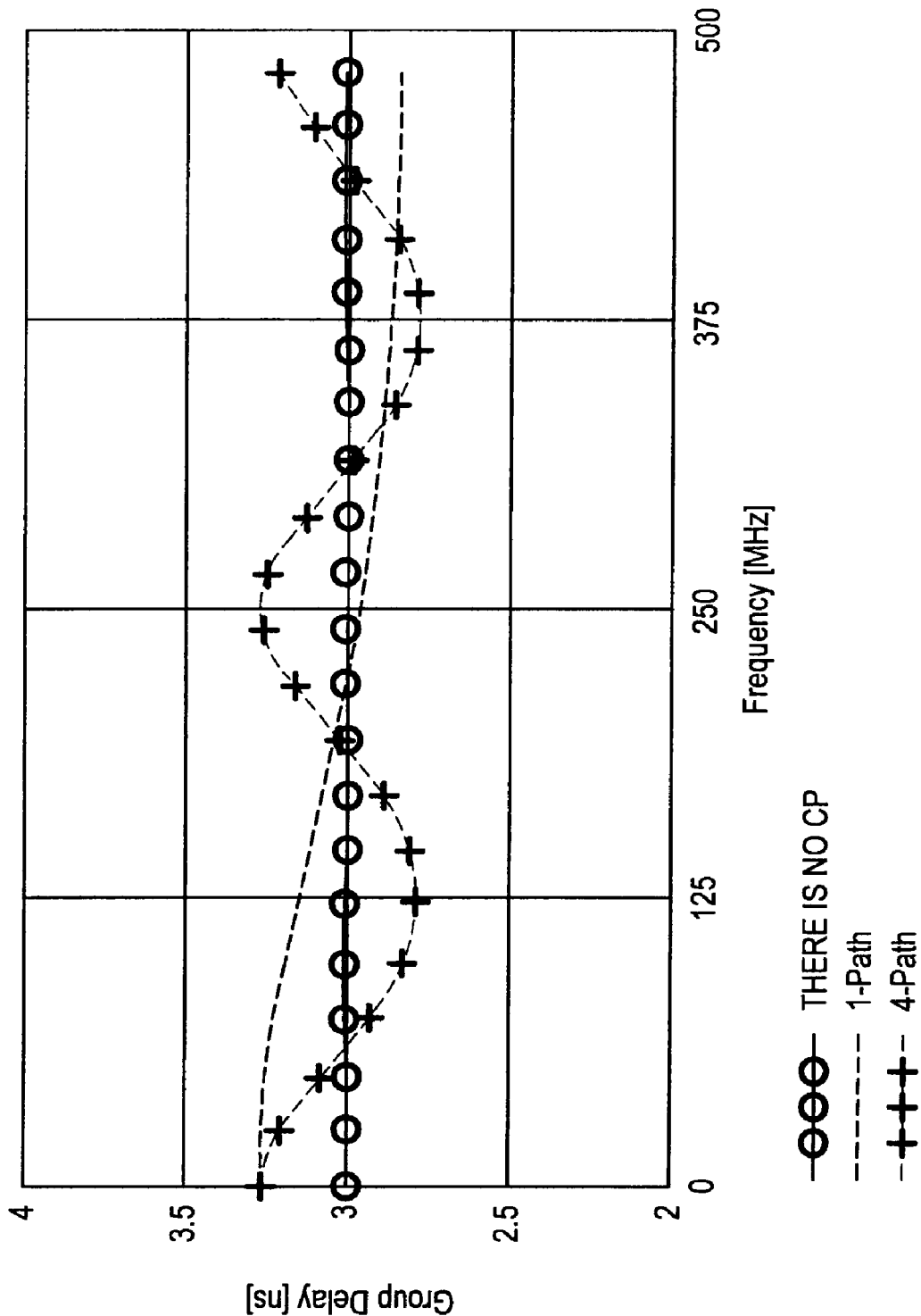
FIG. 11 is a characteristic diagram showing group delay time of the charge domain FIR filter 100 shown in FIG. 1 and the charge domain FIR filter 200 according to the first embodiment.

Next, a second embodiment of the present invention will be described. As described above, in the charge domain FIR filter 200 according to the first embodiment, the connection node 108 between the first stage and the second stage is divided into a plurality of nodes by arranging them in parallel. Thus, it is possible to reduce the change in frequency characteristics caused by parasitic capacitance. FIG. 11 is a characteristic diagram showing group delay time of the charge domain FIR filter 100 shown in FIG. 1 and of the charge domain FIR filter 200 according to the first embodiment. As shown in FIG. 11, when comparing the frequency characteristics based on the group delay time, it can be seen that short-wavelength waves are generated in the 4-path charge domain FIR filter 200.

Figure 12:
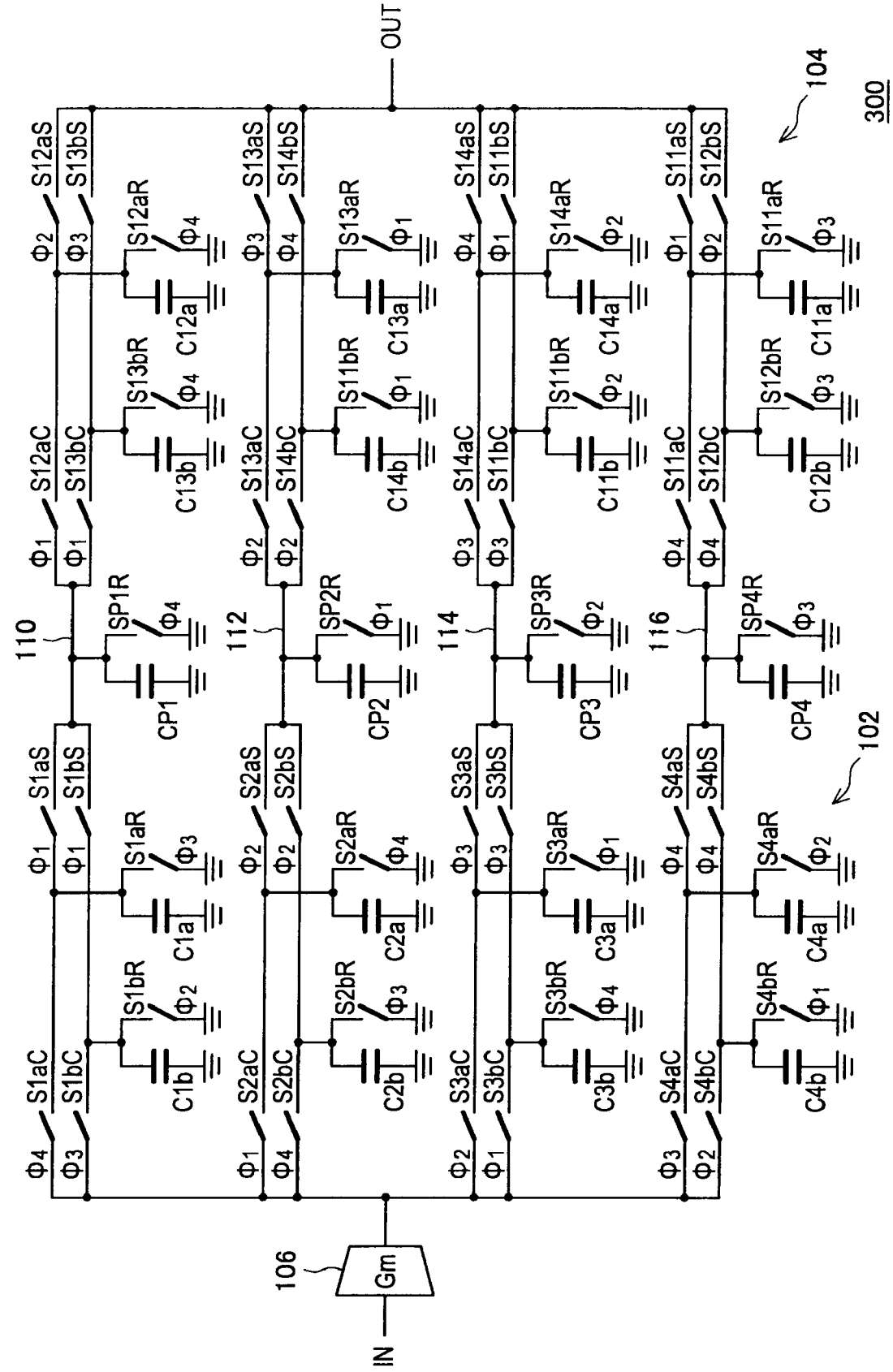
FIG. 12 is a schematic diagram showing the structure of a charge domain FIR filter 300 according to a second embodiment.

In the second embodiment according to the present invention, the parasitic capacitance that is the N-path filter is reset when the phase characteristic is important. FIG. 12 is a schematic diagram showing the structure of a charge domain FIR filter 300 according to the second embodiment. As shown in FIG. 12, in the charge domain FIR filter 300 according to the second embodiment, reset switches SP1R, SP2R, SP3R and SP4R are added to the circuit shown in FIG. 10 in order to reset the parasitic capacitance.

In this example, the timing phase in which each of the reset switches SP1R, SP2R, SP3R and SP4R is turned on is determined as a timing one clock before the first stage sampling capacitors are brought into a share state. More specifically, the reset switch SP1R is turned on at a timing at which the clock signal Φ4 goes high, and the reset switch SP2R is turned on at a timing at which the clock signal Φ1 goes high. The reset switch SP3R is turned on at a timing at which the clock signal Φ2 goes high, and the reset switch SP4R is turned on at a timing at which the clock signal Φ3 goes high. Note that the timing phase in which each of the reset switches SP1R, SP2R, SP3R and SP4R is turned ON is not limited to the above example. As long as an N-path filter is used, each of the reset switches SP1R, SP2R, SP3R and SP4R can be turned on in a timing phase, during a period from one clock to (N−1) clocks before the first stage sampling capacitors are brought into the share state.

Then, by resetting parasitic capacitances CP1 to CP4, the IIR filter formed by the parasitic capacitances vanishes. As a result, the characteristic of "there is no CP" shown in FIG. 10 and FIG. 11 can be obtained. Accordingly, it is possible to reduce the change in frequency characteristics caused by parasitic capacitance, as well as to suppress deterioration in the phase characteristic.

According to the second embodiment described above, in the N-path structure formed by dividing the connection node 108 between the first stage and the second stage, each of the connection nodes 110, 112, 114 and 116 is provided with the reset switch, and the parasitic capacitance that is the N-path filter is caused to vanish. Thus, it is possible to reduce the change in frequency characteristics caused by parasitic capacitance, as well as to suppress deterioration in the phase characteristic.

3. Third Embodiment

Next, a third embodiment of the present invention will be described. In the third embodiment, in place of adding the reset switches that are described in the second embodiment, the on time of the existing switches is extended to reset the parasitic capacitance.

Figure 13:
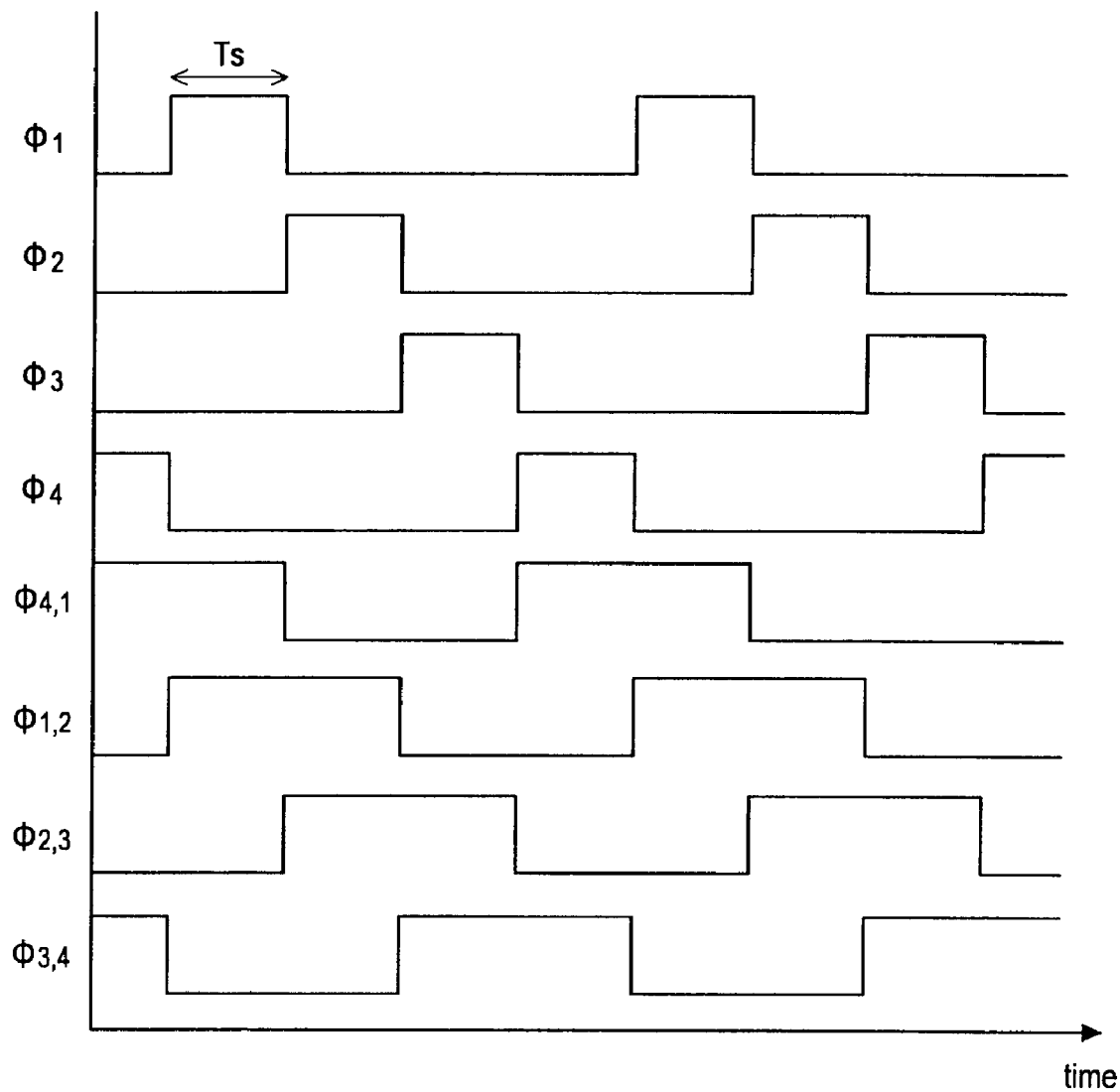
FIG. 13 is a characteristic diagram showing clock signals according to a third embodiment.

FIG. 13 is a characteristic diagram showing clock signals according to a third embodiment. In the third embodiment, clock signals $\Phi_{4,1}$, $\Phi_{1,2}$, $\Phi_{2,3}$, and $\Phi_{3,4}$ are newly provided, in addition to the clock signals Φ1 to Φ4. As shown in FIG. 13, the clock signal $\Phi_{4,1}$ is a signal that goes high at a timing at which the clock signals Φ1 and Φ4 go high, and the clock signal $\Phi_{1,2}$ is a signal that goes high at a timing at which the clock signals Φ1 and Φ2 go high. The clock signal $\Phi_{2,3}$ is a signal that goes high at a timing at which the clock signals Φ2 and Φ3 go high, and the clock signal $\Phi_{3,4}$ is a signal that goes high at a timing at which the clock signals Φ3 and Φ4 go high. The clock signals $\Phi_{4,1}$, $\Phi_{1,2}$, $\Phi_{2,3}$ and $\Phi_{3,4}$ are used to discharge the parasitic capacitance by extending the on time of the existing switches.

Figure 14:
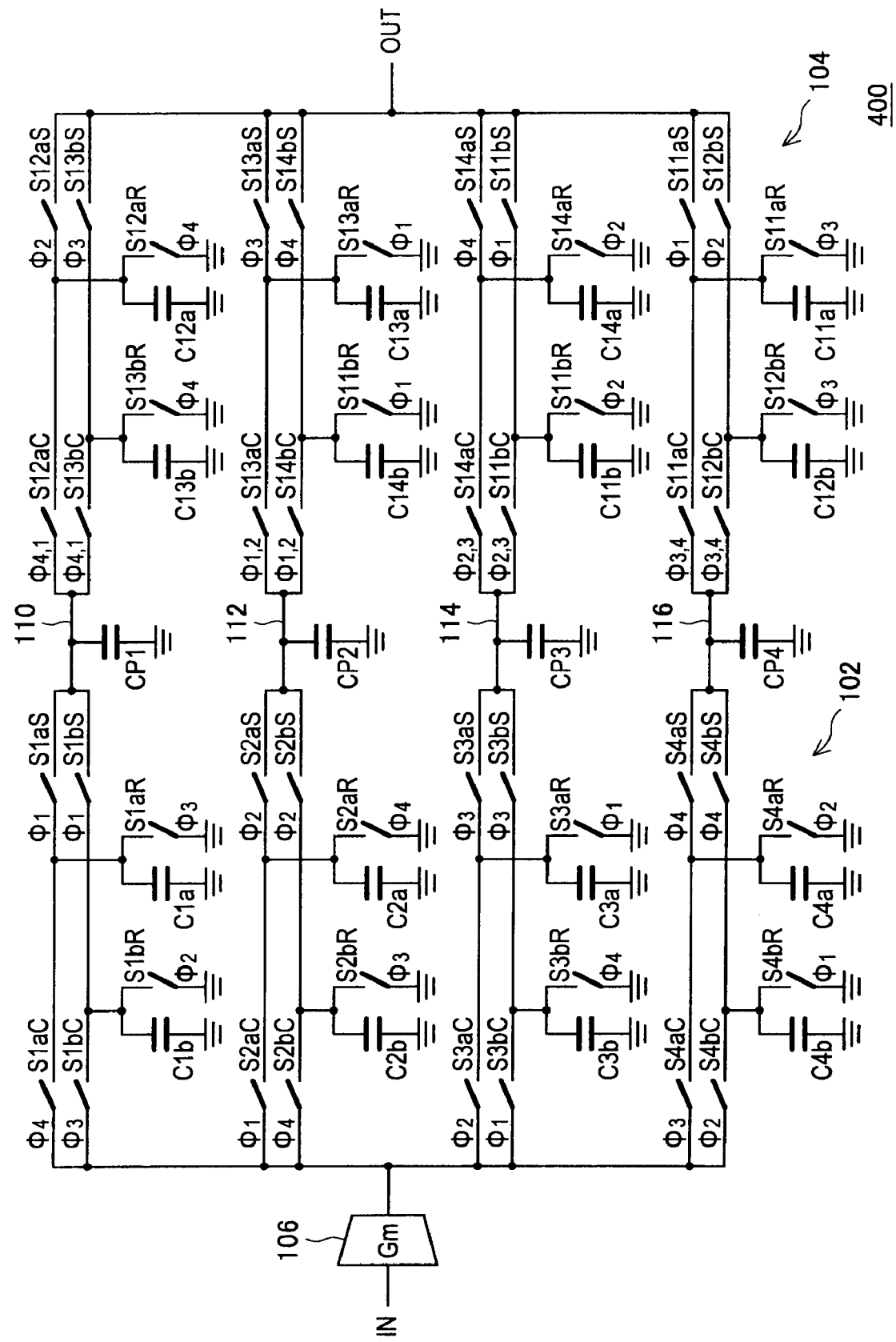
FIG. 14 is a schematic diagram showing a structure of a charge domain FIR filter 400 according to a third embodiment.

FIG. 14 is a schematic diagram showing the structure of a charge domain FIR filter 400 according to the third embodiment. In the structure shown in FIG. 14, as compared to the structure shown in FIG. 10, the charge switches S12aC, S13bC, S13aC, S14bC, S14aC, S11bC, S11aC and S12bC of the second stage FIR filter 104 are operated by the newly provided clock signals $\Phi_{4,1}$, $\Phi_{1,2}$, $\Phi_{2,3}$ and $\Phi_{3,4}$. More specifically, the charge switches S12aC, S13bC, S13aC, S14bC, S14aC, S11bC, S11aC and S12bC are turned on in both the charge timing phase and the reset timing phase described with reference to FIG. 3. Therefore, the parasitic capacitances CP1 to CP4 can be reset simultaneously in the reset timing phase of the second stage FIR filter 104. It is sufficient to provide, on each path, at least one switch that is used to extend the on time.

According to the third embodiment, the charge switches S12aC, S13bC, S13aC, S14bC, S14aC, S11bC, S11aC and S12bC of the second stage FIR filter 104 are operated such that they are turned on in both the charge timing phase and the reset timing phase. Therefore, without newly providing a switch, the parasitic capacitances CP1 to CP4 can be reset by the operations of the charge switches.

4. Fourth Embodiment

Next, a fourth embodiment of the present invention will be described. As described above, in the second and third embodiments, the parasitic capacitances are reset by providing reset switches or adding new clock signals. The fourth embodiment is applicable when addition of reset switches for resetting the parasitic capacitances or addition of clock signals is not allowed because of an increase in consumed electric power, for example.

Figure 15:
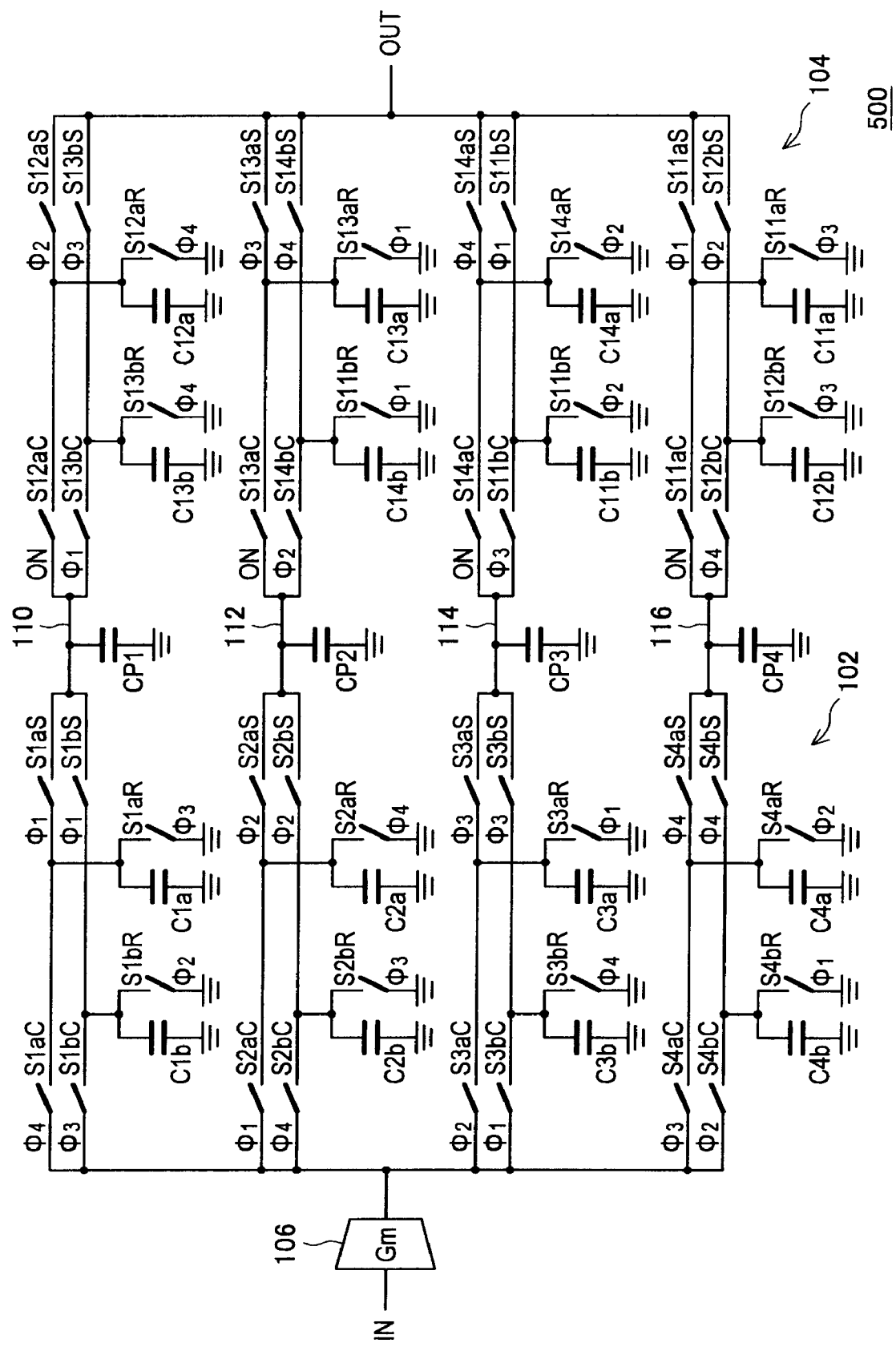
FIG. 15 is a schematic diagram showing a structure of a charge domain FIR filter 500 according to a fourth embodiment.

FIG. 15 is a schematic diagram showing the structure of a charge domain FIR filter 500 according to the fourth embodiment. As shown in FIG. 15, the second stage charge switches S12aC, S13aC, S14aC and S11aC are constantly maintained in an on state. Therefore, the parasitic capacitances CP1 to CP4 are connected in parallel with the second stage sampling capacitors C12a, C13a, C14a and C11a. By maintaining the second stage charge switches S12aC, S13aC, S14aC and S11aC constantly in the on state in this manner, the parasitic capacitances CP1 to CP4 can be used for part of the second stage sampling capacitors C12a, C13a, C14a and C11a. Accordingly, if the reset switches S12aR, S13aR, S14aR and S11aR are turned on, the electric charge of the parasitic capacitances CP1 to CP4 is discharged at the same time as when the electric charge of the sampling capacitors is discharged. As the number of driven switches is reduced, it is expected to reduce the consumed electric power. Regarding the switches that are constantly maintained in the on state, only one switch is provided on each of the connection nodes.

According to the fourth embodiment described above, the second stage charge switches S12aC, S13aC, S14aC and S11aC are constantly maintained in the on state. Therefore, it is possible to reset the parasitic capacitances CP1 to CP4 at the reset timing of the second stage sampling capacitors C12a, C13a, C14a and C11a. Thus, the number of switches is reduced and a simple structure can be provided. At the same time, the number of driven switches is reduced, and it is therefore possible to reduce the consumed electric power.

5. Fifth Embodiment

Next, a fifth embodiment of the present invention will be described. In the fifth embodiment, the parasitic capacitances are actively used to widen the frequency band.

Figure 16:
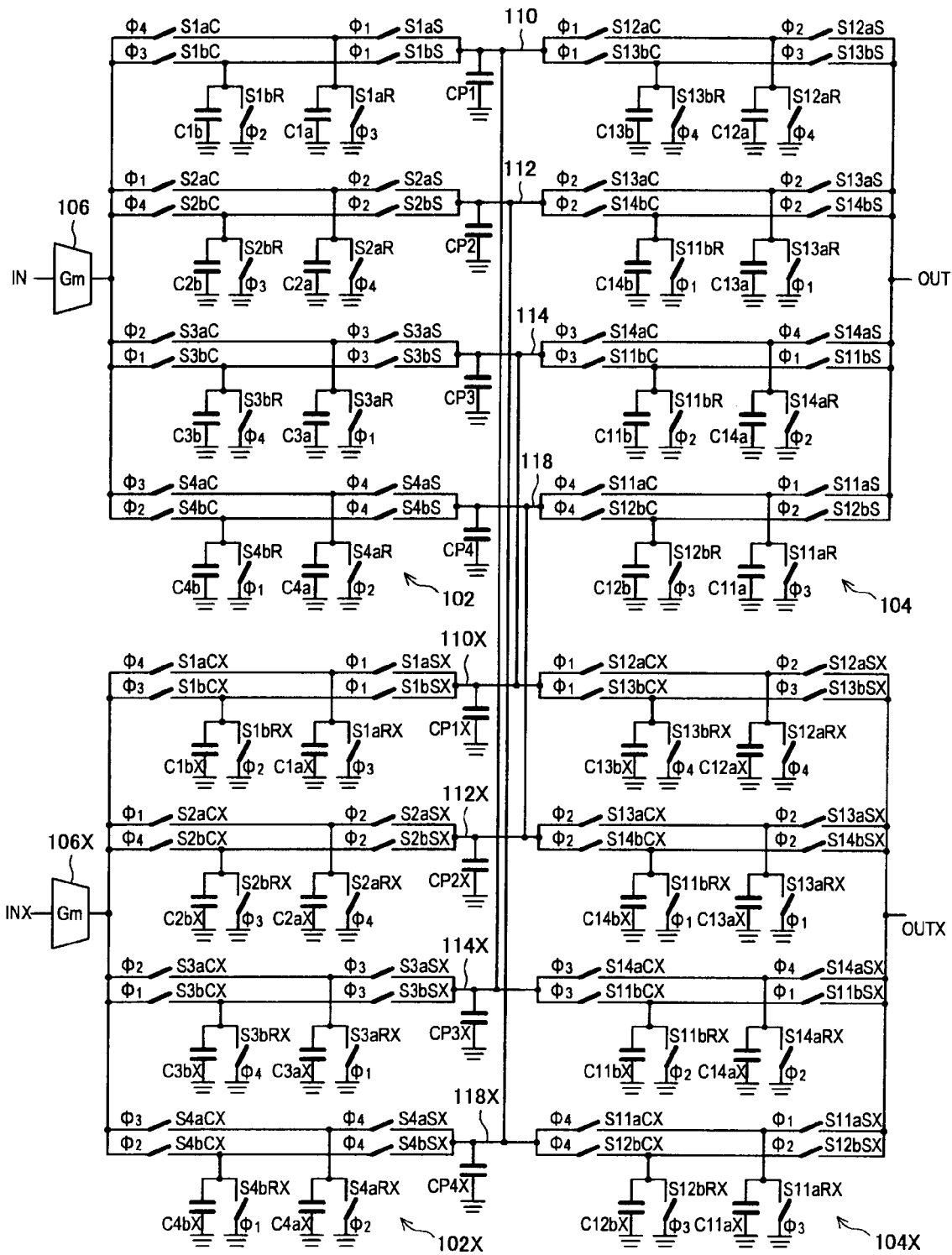
FIG. 16 is a schematic diagram showing a structure of a charge domain FIR filter 600 according to a fifth embodiment.

FIG. 16 is a schematic diagram showing the structure of a charge domain FIR filter 600 according to the fifth embodiment. The FIR filter 600 according to the fifth embodiment has a differential structure, and is formed by an FIR filter in which the two-tap FIR filters 102 and 104 are connected in series, and an FIR filter in which two-tap FIR filters 102X and 104X are connected in series. Differential signals having mutually reverse phases are input to the input terminal IN and an input terminal INX.

In the charge domain FIR filter 600 shown in FIG. 16, the entire circuit is formed as a differential structure. Therefore, the signal voltages at the same node of two circuits have reversed signs and their phases are a positive phase and a negative phase. For example, in FIG. 16, the phases of the signal voltages at the node 110 and a node 110X are the positive phase and the negative phase, and the phases of the signal voltages at the node 112 and a node 112X are the positive phase and the negative phase. Further, the phases of the signal voltages at the node 114 and a node 114X are the positive phase and the negative phase, and the phases of the signal voltages at the node 116 and a node 116X are the positive phase and the negative phase.

As shown in FIG. 16, a positive phase path 1 (the node 110) and a negative phase path 3 (the node 114X) are connected, and a positive phase path 2 (the node 112) and a negative phase path 4 (the node 116X) are connected. Further, a positive phase path 3 (the node 114) and a negative phase path 1 (the node 110X) are connected, and a positive phase path 4 (the node 116) and a negative phase path 2 (the node 112X) are connected.

In this manner, with the charge domain FIR filter 600 according to the fifth embodiment, of the nodes in which parasitic capacitance is generated, the nodes are connected together whose timing phases deviate from each other by N/2. As a result, in the nodes 110, 112, 114 and 116 respectively, the signal of the N/2 preceding timing phase is added as the reverse phase. In this manner, when the positive phase path 1 to path N/2 and the negative phase path N/2+1 to path N are connected, an N/2 order IIR bandpass filter with a transfer function represented by the following Expression 8 can be formed by using the parasitic capacitance. In Expression 8, the reverse phase signal deviated by the N/2 timing phases is added in the IIR bandpass filter. Therefore, $\alpha \cdot z^{(-N/2)}$ is added to 1 in the denominator in the right-hand side.

Expression 8

$$H_{IIR2}(z) = \frac{1-\alpha}{1+\alpha \cdot z^{-\frac{N}{2}}}$$ Expression 8

In the case of FIG. 16, if the parasitic capacitance of one side of each of the switches is 20 fF, the parasitic capacitance of a total of eight switches in the positive and negative phases is CP=160 fF, which corresponds to $C_H$ in Expression 7. Further, if the capacitance of each of the sampling capacitors is 250 fF, because four sampling capacitors are connected to this node in each timing phase, the total capacitance is 1000 ff. Furthermore, because three types of switches, namely, the reset, charge and share switches are attached to each of the four capacitors, a parasitic capacitance of 240 fF of the total of twelve switches is also added. As a result, 1000+240=1240 fF corresponds to $C_R$ in Expression 7. When these values are substituted into Expression 7, $\alpha$=0.114 is obtained.

Figure 17:
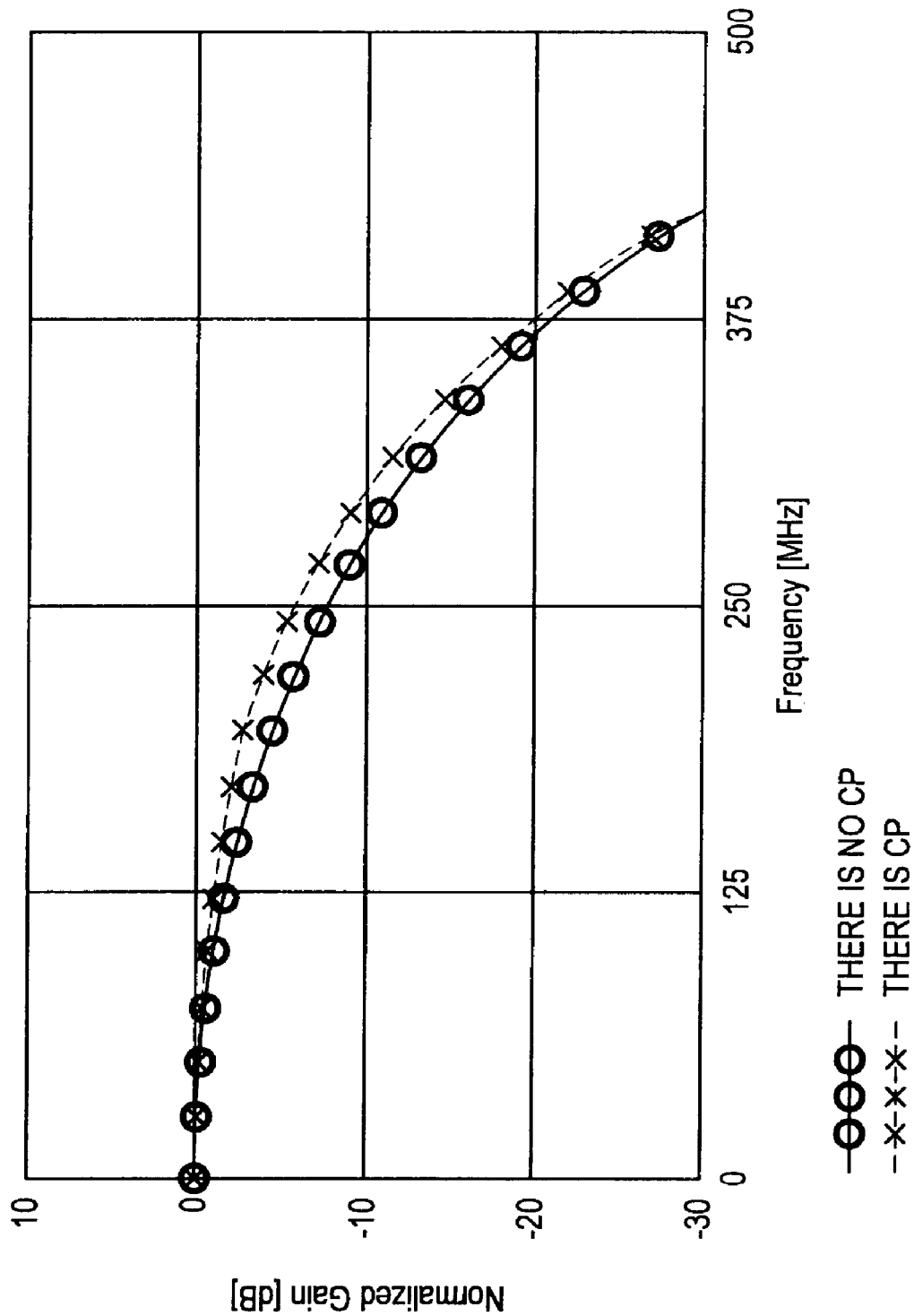
FIG. 17 is a characteristic diagram showing frequency characteristics when the charge domain FIR filter 600 is operated with a sampling time Ts=1 ns.

FIG. 17 is a characteristic diagram showing frequency characteristics when the charge domain FIR filter 600 is operated with a sampling time Ts=1 ns. The frequency characteristics of the charge domain FIR filter 600 according to the fifth embodiment are indicated as the characteristic "there is CP" in FIG. 17. As shown in FIG. 17, in the charge domain FIR filter 600 according to the fifth embodiment, the frequency band is widened as compared to the characteristic "there is no CP". Therefore, it is possible to widen the frequency band by actively using the parasitic capacitances in the positive and negative phases.

Figure 18:
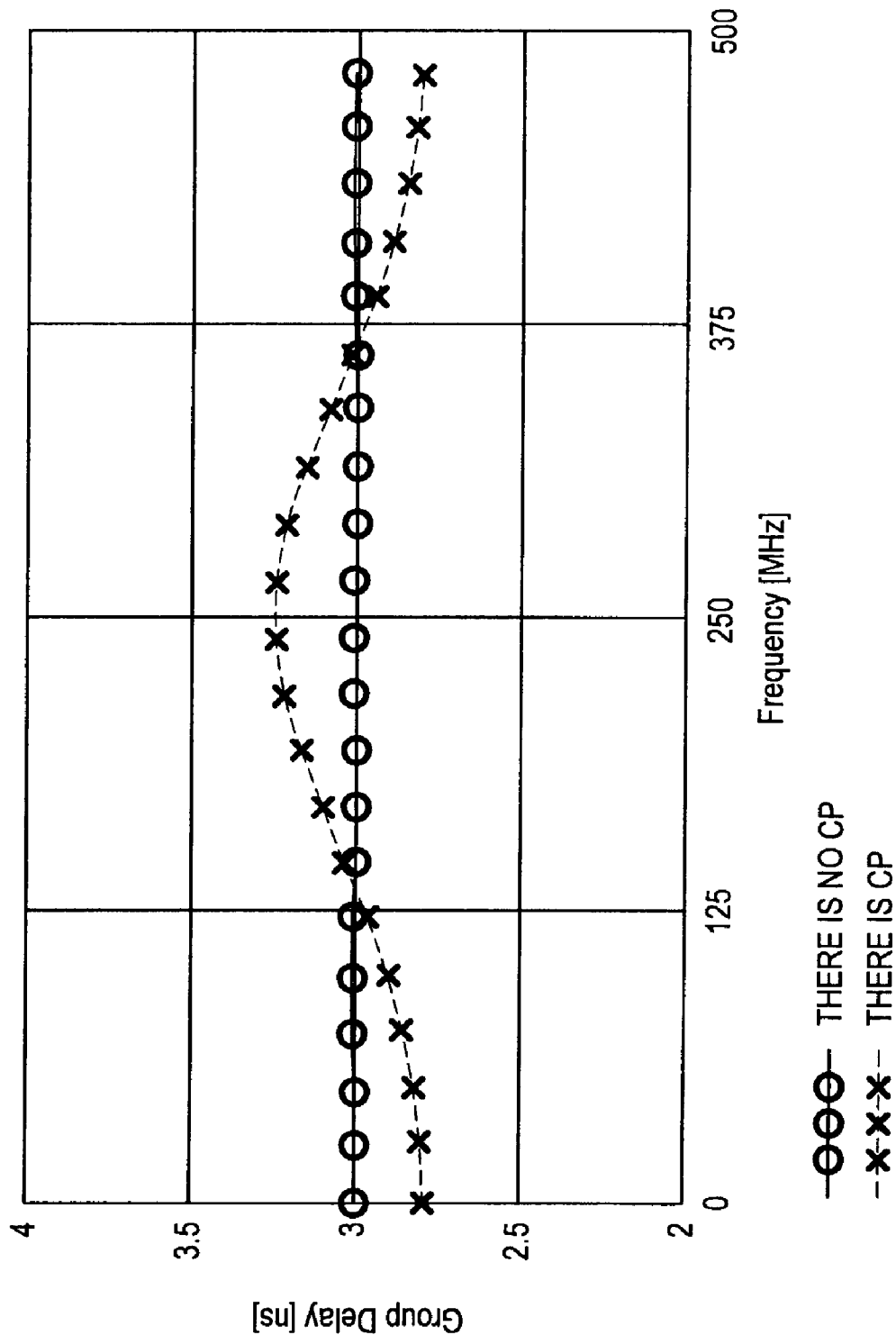
FIG. 18 is a characteristic diagram showing group delay times of the charge domain FIR filter 600 according to the fifth embodiment.

Note that, as shown in FIG. 18, when comparing the frequency characteristics based on the group delay time, some undulations are generated in the case of the FIR filter 600 ("there is CP") according to the fifth embodiment, as compared to the case of "there is no CP". However, these undulations can also be reduced more than in the case of the "4-Path" line shown in FIG. 11.

6. Sixth Embodiment

Figure 19:
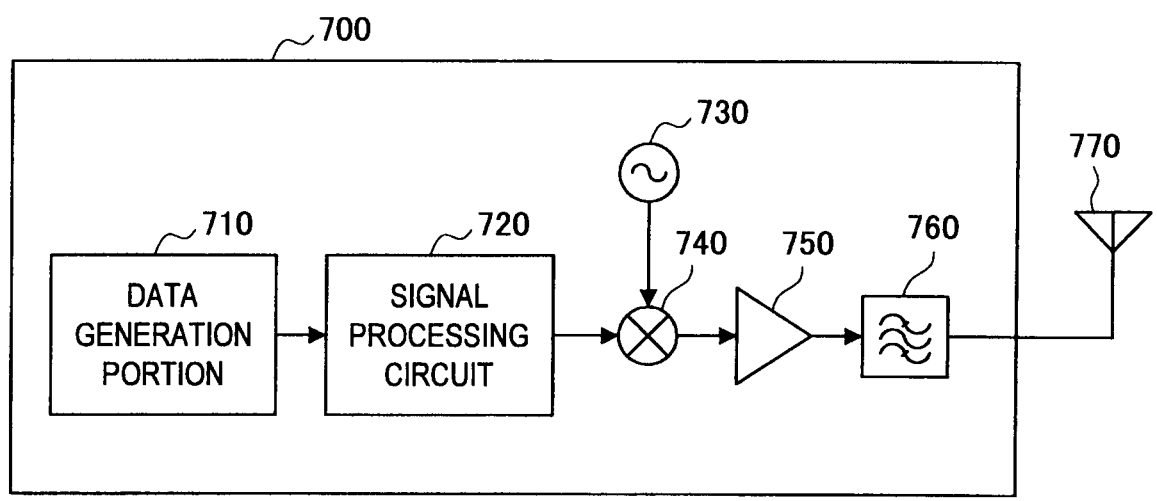
FIG. 19 is a schematic diagram showing the structure of a communication device provided with the charge domain FIR filter according to each of the embodiments.

A six embodiment relates to a communication device 700 provided with the charge domain FIR filter according to each of the above-described embodiments. FIG. 19 is a schematic diagram showing the structure of the communication device 700.

As shown in FIG. 19, the communication device 700 according to the sixth embodiment includes a data generation portion 710, a signal processing circuit 720, a frequency converter 740, a local signal generator 730, an electric power amplifier 750, a band limiting filter 760 and an antenna 770.

Data to be transmitted from the communication device 700 is generated by the data generation portion 710, and input to the signal processing circuit 720. Processing such as D/A conversion, coding and modulation is performed in the signal processing circuit 720. Thus, a baseband transmission signal or an intermediate frequency (IF) band transmission signal is generated. The transmission signal from the signal processing circuit 720 is input to the frequency converter (mixer) 740, and multiplied by a local signal from the local signal generator 730. As a result of the multiplication of the transmission signal by the local signal, the transmission signal is frequency-converted to a radio frequency (RF) band signal. In other words, the transmission signal is up-converted.

The RF signal, which is obtained by the frequency converter 740 up-converting the transmission signal, is amplified by the electric power amplifier 750, and thereafter input to the band limiting filter 760. The band limiting filter 760 performs band limitation on the RF signal, and unnecessary components are removed from the RF signal. Then, the resultant RF signal is supplied to the antenna 770. Note that the various types of charge domain FIR filters according to each of the above-described embodiments can be used as the band limiting filter 760.

According to the sixth embodiment described above, when the FIR filter according to any one of the first to fifth embodiments is used as the band limiting filter 760 of the communication device 700, it is possible to reliably suppress waveform disturbance from occurring in the signal supplied to the antenna 770.

It should be understood by those skilled in the art that various modifications, combinations, sub-combinations and alterations may occur depending on design requirements and other factors insofar as they are within the scope of the appended claims or the equivalents thereof.

The present application contains subject matter related to that disclosed in Japanese Priority Patent Application JP 2009-116728 filed in the Japan Patent Office on May 13, 2009, the entire content of which is hereby incorporated by reference.

What is claimed is:

1. A filter circuit, comprising:
   a voltage-current conversion portion that converts a voltage signal input to an input terminal to a current signal;
   a first capacitor unit comprising a group of first capacitors in electrical connection with the voltage-current conversion portion, wherein:
   the current signal is input to the first capacitors during a first charging period; and
   first outputs of the first capacitors are added to generate a first output current signal for the first capacitor group;
   a second capacitor unit comprising a group of second capacitors; and
   a connection node that electrically connects the first capacitor group to the second capacitor group, wherein:
   the first output current signal is input to the second capacitors during a second charging period;
   second outputs of the second capacitors are added to generate a second output current signal for the second capacitor group;
   the connection node comprises a reset switch electrically connected to ground and associated with a reset time period, activation of the reset switch during the reset time period causing a discharge to ground of the parasitic capacitance of at least one of the first capacitor group or the second capacitor group.

2. The filter circuit of claim 1, wherein:
   the parasitic capacitance of the first capacitor group comprises a first parasitic capacitance associated with at least one of the first capacitors; and
   activation of the reset switch during the reset time period causes the first parasitic capacitance to be discharged to ground.

3. The filter circuit of claim 1, wherein:
   the parasitic capacitance of the second capacitor group comprises a second parasitic capacitance associated with at least one of the second capacitors; and
   activation of the reset switch during the reset time period causes the second parasitic capacitance to be discharged to ground.

4. The filter circuit of claim 1, wherein:
   the first capacitor unit further comprises a plurality of first capacitor groups in electrical connection with the voltage-current conversion portion;
   the current signal is input to the first capacitor groups during the first charging period in accordance with a predetermined sequence; and
   outputs of the first capacitor groups are added to generated an output current signal for the first capacitor unit.

5. The filter circuit of claim 4, wherein:
   the second capacitor unit further comprises a plurality of groups of second capacitors; and
   the filter circuit further comprises a plurality of connection nodes that electrically connect the first capacitor groups with corresponding ones of the second capacitor groups.

6. The filter circuit of claim 5, wherein the plurality of connection nodes are associated with corresponding reset switches, the reset switches being associated with corresponding reset periods.

7. A filter circuit, comprising:
   a first voltage-current conversion portion that converts a first voltage signal input to an input terminal to a first current signal, the first voltage signal being associated with a first voltage phase;
   a first capacitor unit comprising a group of first capacitors in electrical connection with the first voltage-current conversion portion, wherein:
   the first current signal is input to the first capacitors during a first charging period; and
   first outputs of the first capacitors are added to generate a first output current signal for the first capacitor group;
   a second capacitor unit comprising a group of second capacitors;
   a first connection node that electrically connects the first capacitor group to the second capactior group, wherein:
   the first output current signal is input to the second capacitors during a second charging period; and
   second outputs of the second capacitors are added to generate a second output current signal for the second capacitor group;
   a second voltage-current conversion portion that converts a second voltage signal input to an input terminal to a second current signal, the second voltage signal being associated with a second voltage phase;
   a third capacitor unit comprising a group of third capacitors in electrical connection with the second voltage-current conversion portion, wherein:
   the second current signal is input to the third capacitors during a third charging period; and
   third outputs of the third capacitors are added to generate a third output current signal for the third capacitor group;
   a fourth capacitor unit comprising a group of fourth capacitors;
   a second connection node that electrically connects the third capacitor group to the fourth capacitor group wherein:
   the third output current signal is input to the fourth capacitors during a fourth charging period; and
   fourth outputs of the fourth capacitors are added to generate a fourth output current signal for the fourth capacitor group; and
   a third connection node that electrically connects the first connection node to the second connection node.

8. A communication device, comprising:
   a transmission unit; and
   a filter circuit comprising:
   a voltage-current conversion portion that converts a voltage signal input to an input terminal to a current signal;
   a first capacitor unit comprising a group of first capacitors in electrical connection with the voltage-current conversion portion, wherein:
   the current signal is input to the first capacitors during a first charging period; and
   first outputs of the first capacitors are added to generate a first output current signal for the first capacitor group;
   a second capacitor unit comprising a group of second capacitors; and
   a connection node that electrically connects the first capacitor group to the second capacitor group, wherein:
   the first output current signal is input to the second capacitors during a second charging period;
   second outputs of the second capacitors are added to generate a second output current signal for the second capacitor group; and the connection node comprises a reset switch electrically connected to ground and associated with a reset time period, activation of the reset switch during the reset time period causing a discharge to ground of the parasitic capacitance of at least one of the first capacitor group or the second capacitor group.

9. The communication device of claim 8, wherein:
the parasitic capacitance of the first capacitor group comprises a first parasitic capacitance associated with at least one of the first capacitors; and
activation of the reset switch during the reset time period causes the first parasitic capacitance to be discharged to ground.

10. The communication device of claim 8, wherein:
the parasitic capacitance of the second capacitor group comprises a second parasitic capacitance associated with at least one of the second capacitors; and
activation of the reset switch during the reset time period causes the second parasitic capacitance to be discharged to ground.

11. The communication device of claim 8, wherein:
the first capacitor unit further comprises a plurality of first capacitor groups in electrical connection with the voltage-current conversion portion;
the current signal is input to the first capacitor groups during the first charging period in accordance with a predetermined sequence; and
outputs of the first capacitor groups are added to generated an output current signal for the first capacitor unit.

12. The communication device of claim 11, wherein:
the second capacitor unit further comprises a plurality of groups of second capacitors; and
the filter circuit further comprises a plurality of connection nodes that electrically connect the first capacitor groups with corresponding ones of the second capacitor groups.

13. The communication device of claim 12, wherein the plurality of connection nodes are associated with corresponding reset switches, the reset switches being associated with corresponding reset periods.

* * * * *